(12) United States Patent
Lee et al.

(10) Patent No.: US 12,727,291 B2

(45) Date of Patent: Sep. 1, 2026

(54) DISPLAY DEVICE

(71) Applicant: Samsung Display Co., LTD., Yongin-si (KR)

(72) Inventors: Jeong Hyun Lee, Asan-si (KR); Jin Woo Lee, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 844 days.

(21) Appl. No.: 17/985,980

(22) Filed: Nov. 14, 2022

(65) Prior Publication Data

US 2023/0317885 A1 Oct. 5, 2023

(30) Foreign Application Priority Data

Mar. 30, 2022 (KR) ........................ 10-2022-0039755

(51) Int. Cl.

*H10H 20/831* (2025.01)
*H10H 20/857* (2025.01)
*H10H 29/14* (2025.01)

(52) U.S. Cl.

CPC ...... *H10H 20/8316* (2025.01); *H10H 20/857* (2025.01); *H10H 29/142* (2025.01)

(58) Field of Classification Search

CPC ............. H10H 20/8316; H10H 20/857; H10H 29/142; H10H 29/011; H10H 29/14; H10H 29/30; H10H 29/32; H10H 29/34; H10H 29/345; H10H 29/352; H10H 29/362; H10H 29/37; H10H 29/41; H10H 29/45; H10H 29/49; H10H 29/8517; H10H 29/8552; H10H 29/922; H10H 29/942; H10H 29/962; H10H 29/857; H01H 29/49

See application file for complete search history.

(56) References Cited

U.S. PATENT DOCUMENTS

| | | | |
|---|---|---|---|
| 11,626,389 B2 | 4/2023 | Park et al. | |
| 2021/0202796 A1* | 7/2021 | Park | H01L 25/0753 |
| 2023/0044364 A1 | 2/2023 | Bae et al. | |

FOREIGN PATENT DOCUMENTS

| | | |
|---|---|---|
| KR | 10-2021-0084789 A | 7/2021 |
| KR | 10-2021-0098313 | 8/2021 |
| KR | 10-2023-0020627 | 2/2023 |

* cited by examiner

*Primary Examiner* — Latanya N Crawford Eason

(74) *Attorney, Agent, or Firm* — Womble Bond Dickinson (US) LLP

(57) ABSTRACT

A display device includes: a first electrode extending in a first direction, a second electrode extending in the first direction and spaced apart from the first electrode in a second direction intersecting the first direction, and a plurality of light emitting elements disposed on the first electrode and the second electrode. The first electrode includes a recess formed by partially recessing a side of the first electrode facing the second electrode, the second electrode comprises a protrusion disposed on a side of the second electrode facing the first electrode and inserted into the recess, and the plurality of light emitting elements include a first light emitting element disposed on portions of the first electrode and the second electrode extending in the first direction, and a second light emitting element disposed on the recess of the first electrode and disposed on the protrusion of the second electrode.

19 Claims, 16 Drawing Sheets

RME: RME1, RME2
CNE: CNE1, CNE2, CNE3M CNE4

RME: RME1, RME2

DISPLAY DEVICE

CROSS-REFERENCE TO RELATED APPLICATION(S)

This application claims priority to and benefits of Korean Patent Application No. 10-2022-0039755 under 35 U.S.C. § 119, filed on Mar. 30, 2022, in the Korean Intellectual Property Office (KIPO), the entire contents of which are incorporated herein by reference.

BACKGROUND

1. Technical Field

Embodiments relate to a display device.

2. Description of the Related Art

The importance of display devices has steadily increased with the development of multimedia technology. Various types of display devices such as an organic light emitting display (OLED), a liquid crystal display (LCD) and the like have been used in various fields.

As a device for displaying an image of a display device, there is a self-light emitting display device including a light emitting element. The self-light emitting display device includes an organic light emitting display device formed of an organic material as a light emitting material as a light emitting element, an inorganic light emitting display device formed of an inorganic material as a light emitting material, or the like.

SUMMARY

Embodiments provide a display device having an electrode structure capable of increasing the number of light emitting elements capable of emitting light per unit area.

However, aspects of the disclosure are not restricted to one set forth herein. The above and other aspects of the disclosure will become more apparent to one of ordinary skill in the art to which the disclosure pertains by referencing the detailed description of the disclosure provided below.

According to an embodiment, a display device may include: a first electrode extending in a first direction, a second electrode extending in the first direction and spaced apart from the first electrode in a second direction intersecting the first direction, and a plurality of light emitting elements disposed on the first electrode and the second electrode, wherein the first electrode may include a recess formed by partially recessing a side of the first electrode facing the second electrode, the second electrode may include a protrusion disposed on a side of the second electrode facing the first electrode and inserted into the recess, and the plurality of light emitting elements may include a first light emitting element disposed on portions of the first electrode and the second electrode extending in the first direction, and a second light emitting element disposed on the recess of the first electrode and disposed on the protrusion of the second electrode.

The recess of the first electrode may include a first recess portion recessed in the second direction and a second recess portion recessed in a diagonal direction intersecting the first direction and the second direction, and the protrusion of the second electrode may include a first protrusion portion protruding in the second direction and a second protrusion portion protruding in the diagonal direction.

The second light emitting element may be disposed on the second recess portion recessed in the diagonal direction and the second protrusion portion protruding in the diagonal direction.

Each of the first light emitting element and the second light emitting element may have a shape extending in a longitudinal direction, and an orientation direction of end portions of the first light emitting element may be different from an orientation direction of end portions of the second light emitting element are oriented.

The second light emitting element may be disposed not to be parallel with the first light emitting element.

The second electrode may include a first electrode line and a second electrode line spaced apart from each other in the second direction, the first electrode disposed between the first electrode line and the second electrode line, the first electrode line may adjacent to a first side of the first electrode in the second direction, the second electrode line may be adjacent to a second side of the second direction, and the recess of the first electrode may be adjacent to a first side of the first electrode, and the recess of the first electrode may be not adjacent to a second side of the first electrode facing the second electrode line.

The display device may further include a first connection electrode disposed on the first electrode, and a second connection electrode including a first contact portion spaced apart from the first connection electrode in the second direction and disposed on the first electrode line, a second contact portion spaced apart from the first connection electrode in the first direction and disposed on the first electrode, and a first connection portion connecting the first contact portion to the second contact portion, wherein the first connection electrode may be in contact with a first end portion of the first light emitting element, the first contact portion of the second connection electrode may be in contact with a second end portion of the first light emitting element, and the first connection portion may be in contact with a first end portion of the second light emitting element.

The plurality of light emitting elements may further include a third light emitting element spaced apart from the first light emitting element in the first direction and disposed on the first electrode line and the first electrode, and a fourth light emitting element spaced apart from the third light emitting element in the second direction and disposed on the second electrode line and the first electrode, and the display device may further include a third connection electrode spaced apart from the first contact portion of the second connection electrode in the first direction and disposed on the first electrode line, and a fourth connection electrode including a third contact portion spaced apart from the second contact portion in the second direction and disposed on the second electrode line, a fourth contact portion spaced apart from the second contact portion in the first direction and disposed on the first electrode, and a second connection portion connecting the third contact portion to the fourth contact portion.

The second contact portion of the second connection electrode may be in contact with a first end portion of the third light emitting element and an end portion of the fourth light emitting element, the second connection portion may be in contact with a second end portion of the second light emitting element, and the third connection electrode may be in contact with a second end portion of the third light emitting element.

A width of the second contact portion of the second connection electrode in the second direction may be greater than a width of the fourth contact portion of the fourth connection electrode in the second direction.

The plurality of light emitting elements may further include a fifth light emitting element spaced apart from the fourth light emitting element in the first direction and disposed on the second electrode line and the first electrode, and the display device may further include a common connection electrode in contact with an end portion of the fifth light emitting element and disposed on the second electrode line.

The third connection electrode may be electrically connected to the common connection electrode.

The display device may further include a first insulating layer disposed on the first electrode and the second electrode, a second insulating layer disposed on the plurality of light emitting elements, and a third insulating layer disposed on the second insulating layer, wherein the first connection electrode and the third connection electrode may be disposed on the third insulating layer, and the second connection electrode and the fourth connection electrode may be disposed between the second insulating layer and the third insulating layer.

The first connection electrode and the second connection electrode in contact with end portions of of the first light emitting element may be disposed on different layers, and in, the second connection electrode and the fourth connection electrode in contact with end portions of the second light emitting element may be disposed on a same layer.

According to an embodiment of the disclosure, a display device including a plurality of sub-pixels arranged in a first direction and a second direction intersecting the first direction, wherein the plurality of sub-pixel may include a first electrode extending in the first direction, a second electrode including a first electrode line disposed on a side of the first electrode in the second direction, and a second electrode line disposed on another side of the first electrode in the second direction, and a plurality of light emitting elements disposed on the first electrode and the second electrode, the first electrode may include a recess formed by partially recessing a side of the first electrode facing the first electrode line, the first electrode line of the second electrode may include a protrusion disposed on a side of the second electrode facing the first electrode to be inserted into the recess, and the plurality of light emitting elements may include a first light emitting element disposed on portions of the first electrode and the first electrode line extending in the first direction, a second light emitting element disposed in the recess of the first electrode and disposed on the protrusion of the second electrode, a third light emitting element disposed on the first electrode and a portion of the first electrode line extending in the first direction and spaced apart from the first light emitting element in the first direction, a fourth light emitting element disposed on portions of the first electrode and the second electrode line extending in the first direction and spaced apart from the third light emitting element in the second direction, and a fifth light emitting element disposed on the portions of the first electrode and the second electrode line extending in the first direction and spaced apart from the fourth light emitting element in the first direction.

The recess of the first electrode may include a first recess portion recessed in the second direction and a second recess portion recessed in a diagonal direction crossing the first direction and the second direction, and the protrusion of the second electrode may include a first protruding portion protruding in the second direction and a second protruding portion protruding in the diagonal direction.

The second light emitting element may be disposed on the second recess portion recessed in the diagonal direction and the second protruding portion protruding in the diagonal direction.

The display device may further include a first connection electrode disposed on the first electrode, a second connection electrode including a first contact portion spaced apart from the first connection electrode in the second direction and disposed on the first electrode line, a second contact portion spaced apart from the first connection electrode in the first direction and disposed on the first electrode, and a first connection portion connecting the first contact portion to the second contact portion, a third connection electrode spaced apart from the first contact portion of the second connection electrode in the first direction and disposed on the first electrode line, a fourth connection electrode including a third contact portion spaced apart from the second contact portion in the second direction and disposed on the second electrode line, a fourth contact portion spaced apart from the second contact portion in the first direction and disposed on the first electrode, and a second connection portion connecting the third contact portion to the fourth contact portion, and a common connection electrode spaced apart from the fourth contact portion in the second direction and disposed on the second electrode line.

End portions of the first light emitting element may be in contact with the first connection electrode and the first contact portion of the second connection electrode, end portions of the second light emitting element may be in contact with the first connection portion of the second connection electrode and the second connection portion of the fourth connection electrode, the first connection electrode and the first contact portion of the second connection electrode may be disposed on different layers, and the first connection portion and the second connection portion may be disposed on a same layer.

The display device may further include a bank layer surrounding an emission area in which the light emitting elements of the plurality of sub-pixels are disposed, wherein the sub-pixel may include a first sub-pixel in which the first connection electrode is disposed adjacent to a side of the emission area in the first direction, and a second sub-pixel in which the first connection electrode is disposed adjacent to another side of the emission area in the first direction.

In the display device according to an embodiment, one of electrodes facing each other may include a recess and another one thereof may include a protrusion, so that in addition to a path between the electrodes, a region in which light emitting elements may be additionally arranged may be included. In the display device, a larger number of light emitting elements may be disposed per unit area, and thus luminance per unit area may be improved.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
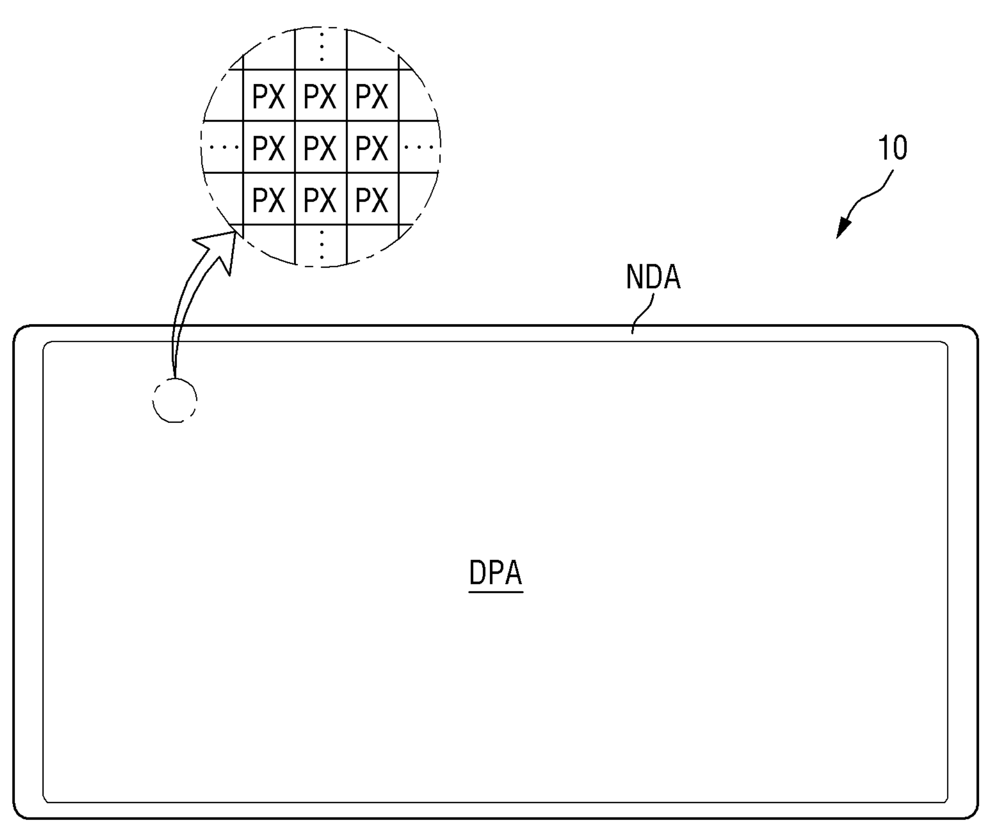
FIG. 1 is a schematic plan view of a display device according to an embodiment.
Figure 1:
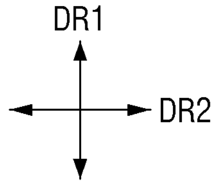

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

It will also be understood that when a layer is referred to as being "on" another layer or substrate, it can be directly on the other layer or substrate, or intervening layers may also be present. When an element, such as a layer, is referred to as being "connected to," or "coupled to" another element or layer, it may be directly connected to, or coupled to the other element or layer or intervening elements or layers may be present. When, however, an element or layer is referred to as being "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may refer to any electronic device with a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which have a display screen.

The display device 10 may include a display panel which has a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described as an example, but embodiments are not limited thereto, and other display panels may be applied to embodiments.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where an image is displayed, and the non-display area NDA may be an area where a screen is not displayed. The display area DPA may also be referred to as an active region, and the non-display area NDA may also be referred to as a non-active region. The display area DPA may substantially occupy the center area of the display device 10.

The display area DPA may include pixels PX. The pixels PX may be arranged in a matrix form. The shape of each pixel PX may be a rectangular or square shape in a plan view. However, embodiments are not limited thereto, and it may be a rhombic shape in which each side is inclined with respect to a direction. The pixels PX may be arranged in a stripe type or an island type. For example, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
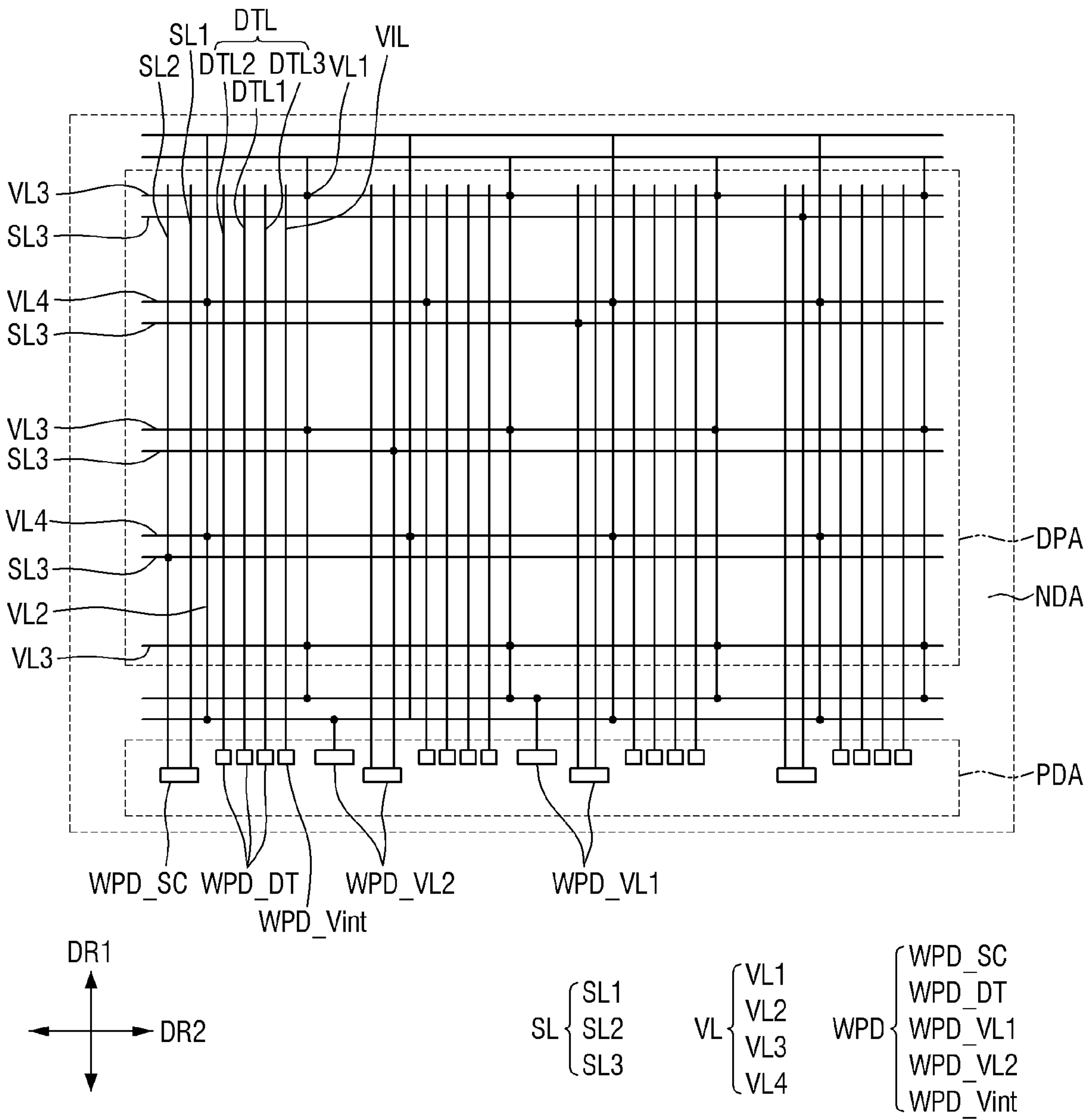
FIG. 2 is a schematic plan view illustrating an arrangement of a plurality of wires included in a display device according to an embodiment.

FIG. 2 is a schematic plan view illustrating an arrangement of wires included in a display device according to an embodiment.

Referring to FIG. 2, the display device 10 may include wires. The display device 10 may include scan lines SL (e.g., SL1, SL2, and SL3), data lines DTL (e.g., DTL1, DTL2, and DTL3), an initialization voltage line VIL, and voltage lines VL (e.g., VL1, VL2, VL3, and VL4). For example, other wires may be further formed in the display device 10. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the first direction DR1. The first scan line SL1 and the second scan line SL2 may be adjacent to each other, and may be spaced apart from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may extend from the pad area PDA disposed in the non-display area NDA to the display area DPA.

The third scan line SL3 may extend in the second direction DR2, and may be spaced apart from the other third scan line SL3 in the first direction DR1. A third scan line SL3 may be connected to one or more first scan lines SL1 or one or more second scan lines SL2. The scan lines SL may have a mesh structure in the entire surface of the display area DPA, but embodiments are not limited thereto.

The data lines DTL may extend in the first direction DR1. The data line DTL may include a first data line DTL1, a second data line DTL2, and a third data line DTL3, and each one of the first to third data lines DTL1, DTL2, and DTL3 may form a pair and may be disposed adjacent to each other. Each of the data lines DTL1, DTL2, and DTL3 may extend from the pad area PDA disposed in the non-display area NDA to the display area DPA. However, embodiments are not limited thereto, and the data lines DTL may be spaced apart from each other at equal intervals between a first voltage line VL1 and a second voltage line VL2 to be described below.

The initialization voltage line VIL may extend in the first direction DR1. The initialization voltage line VIL may be disposed between the data lines DTL and the first voltage line VL1. The initialization voltage line VIL may extend from the pad area PDA disposed in the non-display area NDA to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DPA. For example, some of the wires (e.g., the third voltage line VL3 and the fourth voltage line VL4) may be disposed in the display area DPA and other wires (e.g., the third voltage line VL3 and the fourth voltage line VL4) may be disposed in the non-display area NDA positioned on sides (e.g., opposite sides) of the display area DPA in the first direction DR1, respectively. The voltage lines VL may have a mesh structure on the entire surface of the display area DPA. However, embodiments are not limited thereto.

The first scan line SL1, the second scan line SL2, the data line DTL, the initialization voltage line VIL, the first voltage line VL1, and the second voltage line VL2 may be connected (e.g., electrically connected) to at least one line pad WPD. For example, the first scan line SL1 and the second scan line SL2 may be connected to the scan line pad WPD_SC disposed in the pad area PDA, and the data lines DTL may be connected to the data line pads WPD_DT different from each other, respectively. The initialization voltage line VIL may be connected to an initialization line pad WPD Vint, the first voltage line VL1 may be connected to a first voltage line pad WPD VL1, and the second voltage line VL2 may be connected to a second voltage line pad WPD_VL2. The external devices may be mounted on the line pads WPD.

Each pixel PX or sub-pixel SPXn (where n is an integer of 1 to 3) of the display device 10 may include a pixel driving circuit. The above-described wires may pass through each pixel PX or the periphery of each pixel PX to apply a driving signal to each pixel driving circuit. The pixel driving circuit may include transistors and capacitors. According to an embodiment, in each sub-pixel SPXn of the display device 10, the pixel driving circuit may have a 3T-1C structure including three transistors and a capacitor. Hereinafter, the pixel driving circuit of the 3T-1C structure will be described as an example, but embodiments are not limited thereto, and various other modified structures such as a 2T-1C structure, a 7T-1C structure, and a 6T-1C structure may be applied.

Figure 3:
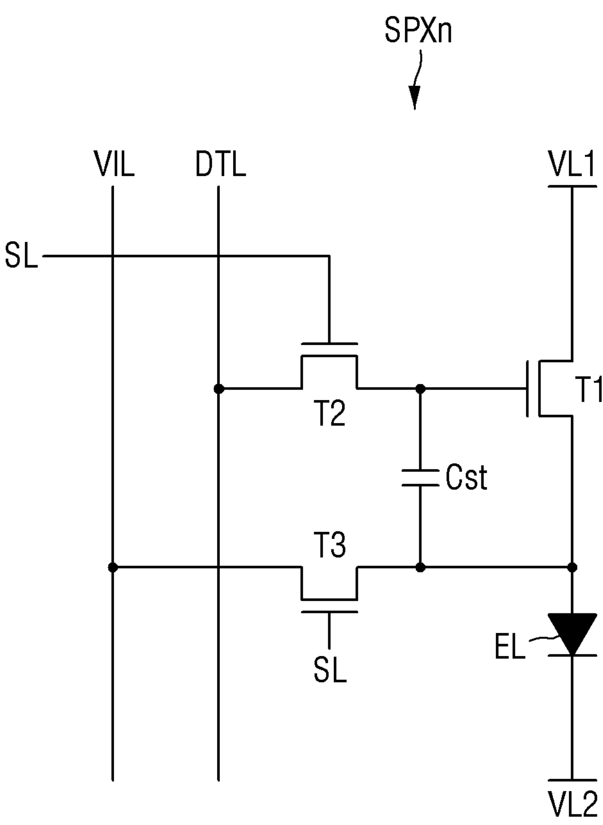
FIGS. 3 and 4 are schematic diagrams of equivalent circuits of a sub-pixel of a display device according to an embodiment.
Figure 4:
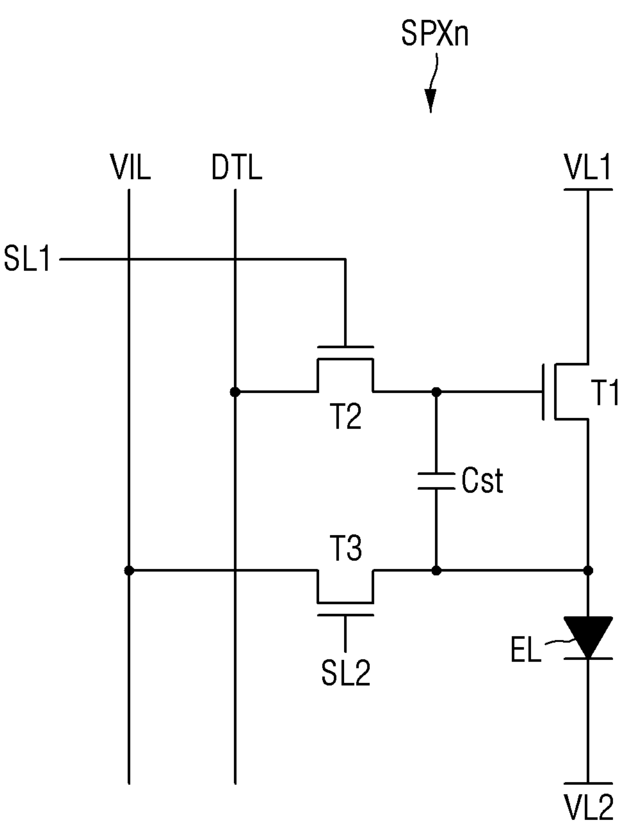

FIGS. 3 and 4 are schematic diagrams of equivalent circuits of a sub-pixel of a display device according to an embodiment.

Referring to FIG. 3, each sub-pixel SPXn of the display device 10 according to an embodiment may include three transistors T1, T2 and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between the first electrode and the second electrode. The light emitting element may emit light of a specific wavelength band by electrical signals transmitted from the first electrode and the second electrode.

An end portion of the light emitting diode EL may be connected to the source electrode of the first transistor T1, and another end portion of the light emitting diode EL may be connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 may be turned on by a scan signal of the scan line SL to connect the data line DTL to the gate electrode of the first transistor T1. The gate electrode of the second transistor T2 may be connected to the scan line SL, the source electrode of the second transistor T2 may be connected to the gate electrode of the first transistor T1, and the drain electrode of the second transistor T2 may be connected to the data line DTL.

The third transistor T3 may be turned on by a scan signal of the scan line SL to connect the initialization voltage line VIL to an end portion of the light emitting diode EL. The gate electrode of the third transistor T3 may be connected to the scan line SL, the drain electrode of the third transistor T3 may be connected to the initialization voltage line VIL, and the source electrode of the third transistor T3 may be connected to an end portion of the light emitting diode EL or to the source electrode of the first transistor T1.

In an embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but embodiments are not limited thereto. For example, each of the transistors T1, T2, and T3 may be formed of a P-type MOSFET. In another example, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst may store a difference voltage between a gate voltage and a source voltage of the first transistor T1.

In an embodiment of FIG. 3, the gate electrode of the second transistor T2 and the gate electrode of the third transistor T3 may be connected to the same scan line SL. The second transistor T2 and the third transistor T3 may be turned on in response to a scan signal applied from the same scan line SL. However, embodiments are not limited thereto.

Referring to FIG. 4, the gate electrodes of the second transistor T2 and the third transistor T3 may be connected to different scan lines SL1 and SL2. For example, the gate electrode of the second transistor T2 may be connected (e.g., electrically connected) to the first scan line SL1, and the gate electrode of the third transistor T3 may be connected (e.g., electrically connected) to the second scan line SL2. The second transistor T2 and the third transistor T3 may be simultaneously turned on by scan signals applied from different scan lines.

Hereinafter, a structure of a pixel PX of the display device 10 according to an embodiment will be described in detail with further reference to other drawings.

Figure 5:
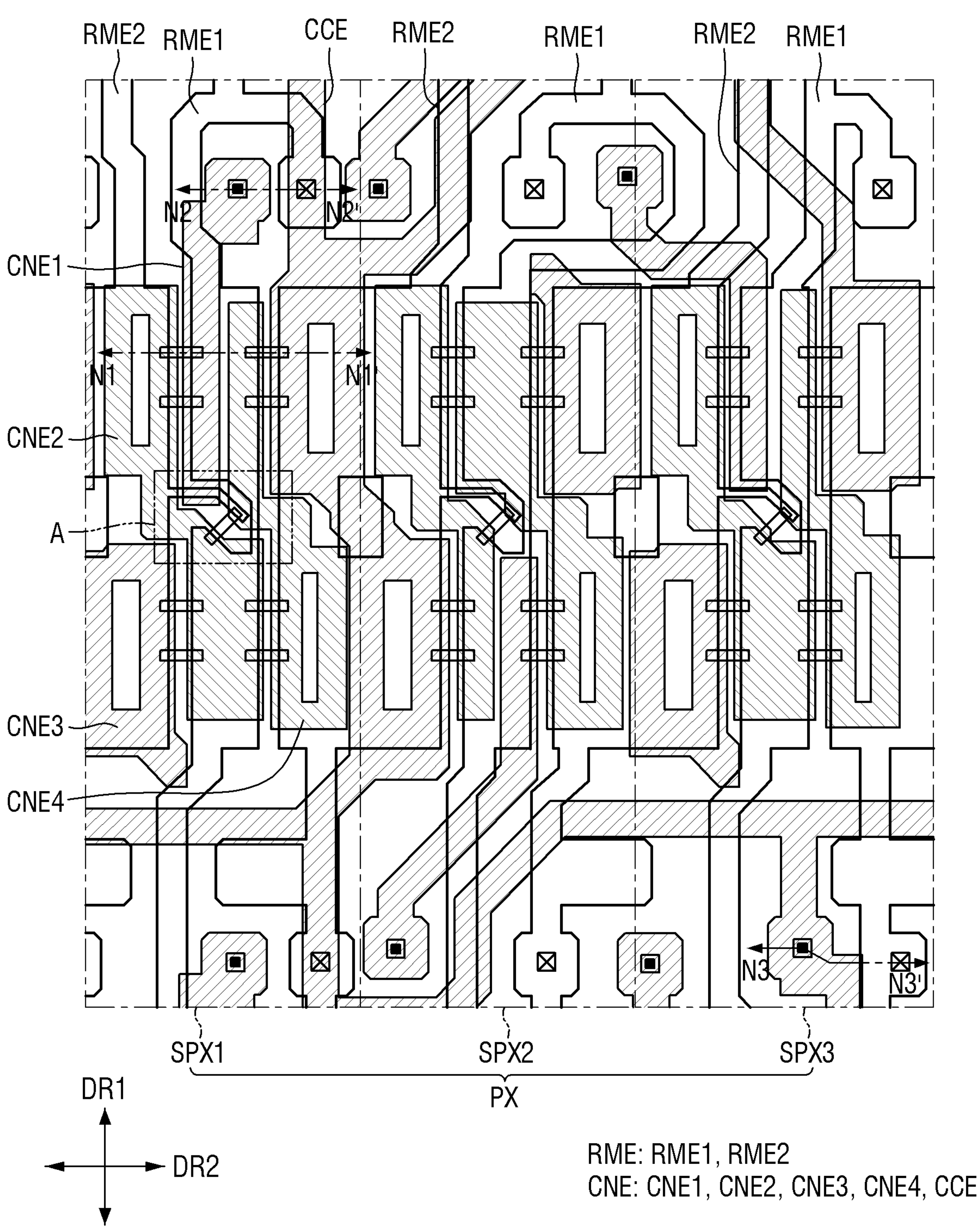
FIG. 5 is a schematic plan view of a pixel of a display device according to an embodiment.
Figure 6:
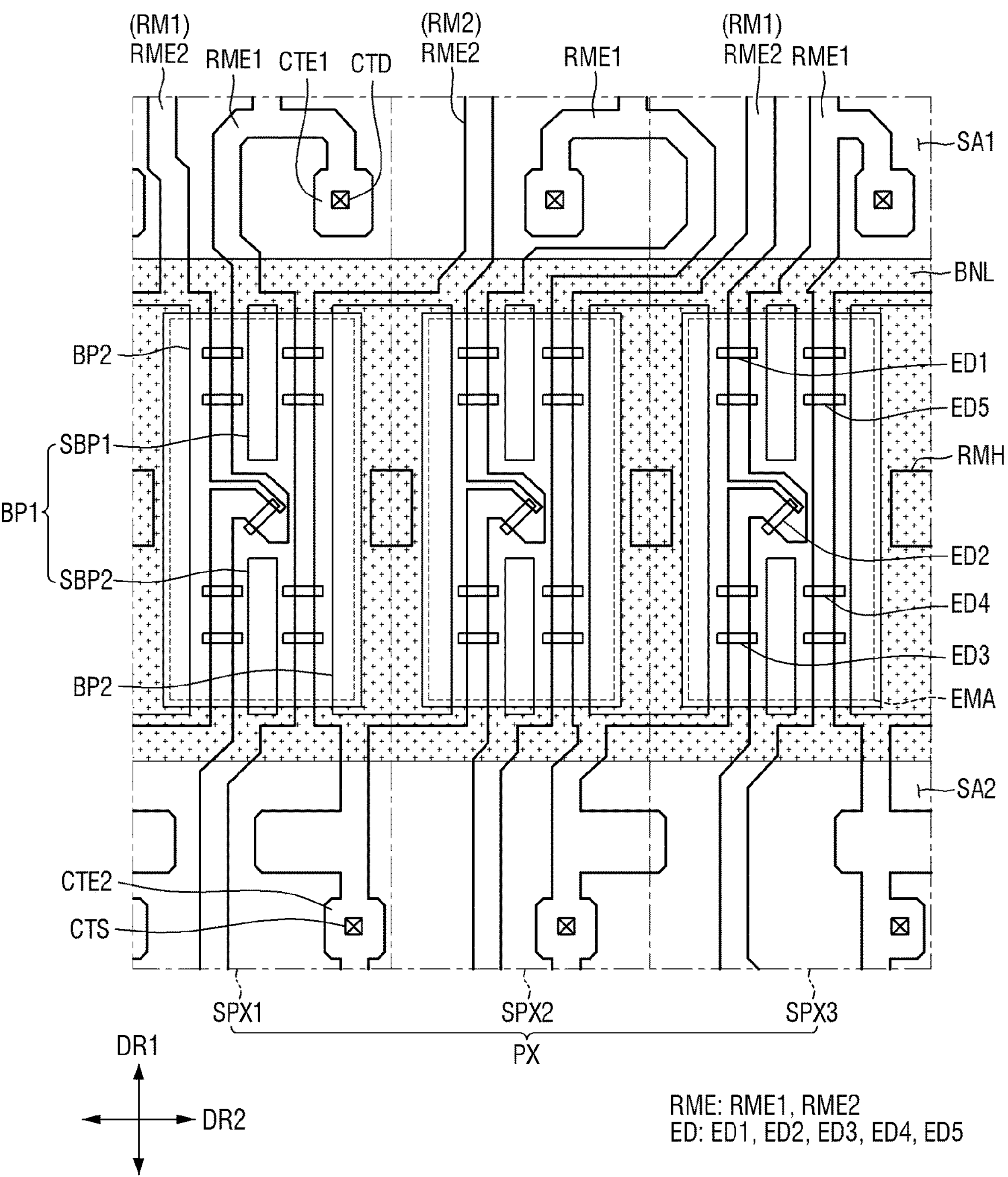
FIG. 6 is a schematic plan view illustrating an arrangement of a bank layer and electrodes disposed in a pixel of FIG. 5.
Figure 7:
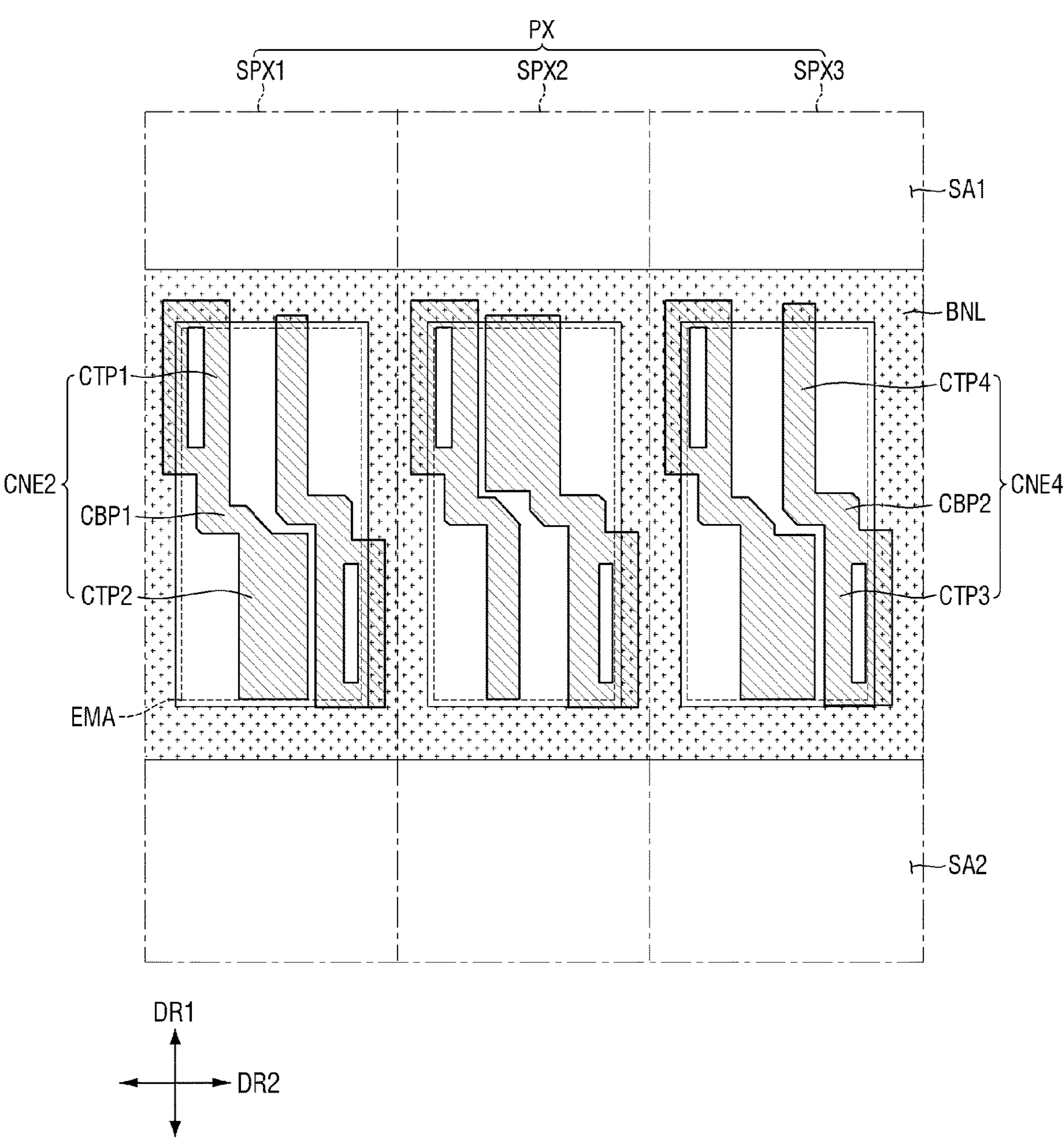
FIG. 7 is a schematic plan view illustrating an arrangement of connection electrodes of a first connection electrode layer disposed in a pixel of FIG. 5.
Figure 8:
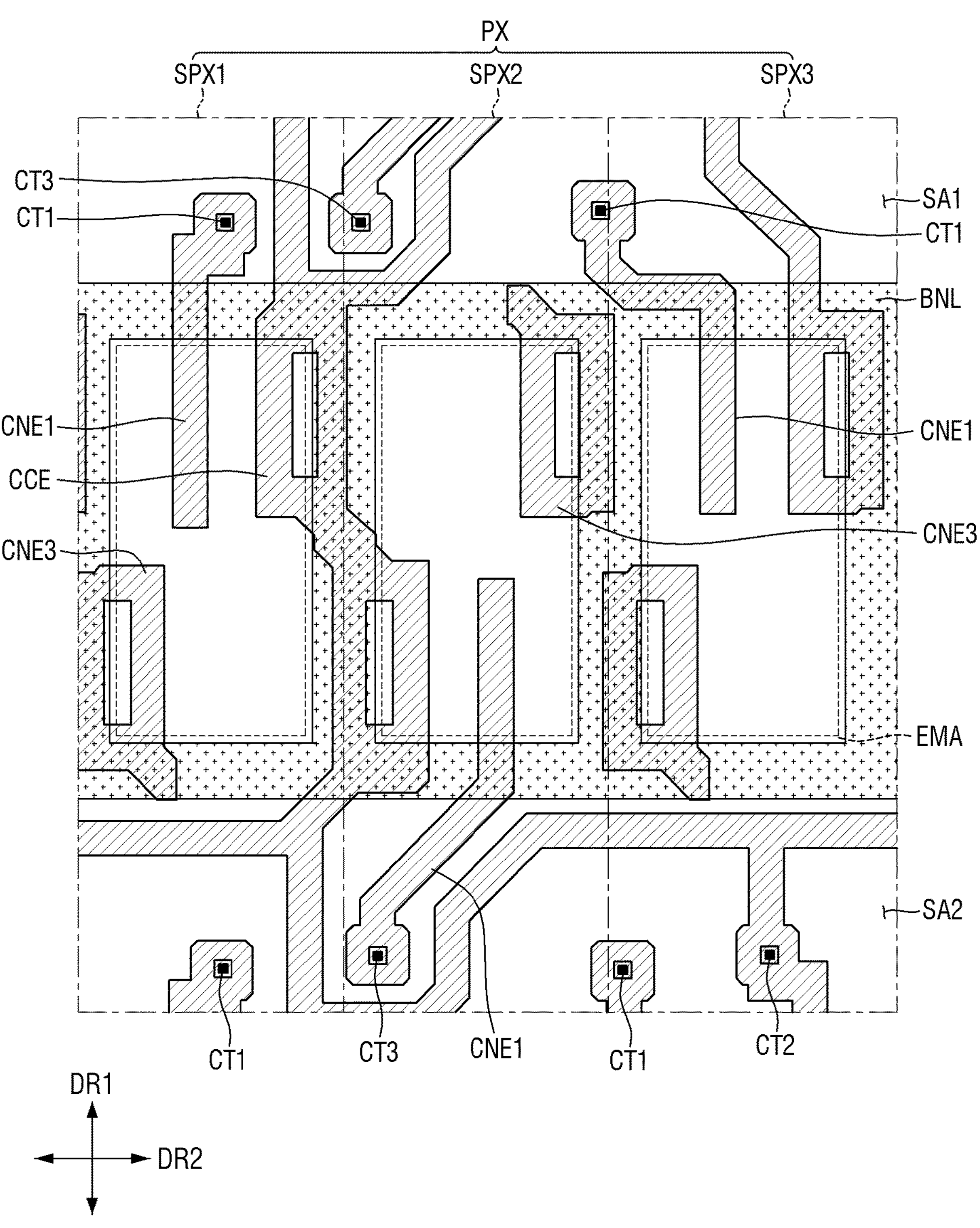
FIG. 8 is a schematic plan view illustrating an arrangement of connection electrodes of a second connection electrode layer disposed in a pixel of FIG. 5.

FIG. 5 is a schematic plan view of a pixel of a display device according to an embodiment. FIG. 6 is a schematic plan view illustrating an arrangement of a bank layer and electrodes disposed in a pixel of FIG. 5. FIG. 7 is a schematic plan view illustrating an arrangement of connection electrodes of a first connection electrode layer disposed in a pixel of FIG. 5. FIG. 8 is a schematic plan view illustrating an arrangement of connection electrodes of a second connection electrode layer disposed in a pixel of FIG. 5.

FIG. 5 illustrates a planar arrangement of electrodes RME (e.g., RME1 and RME2), barrier walls BP1 and BP2 and a bank layer BNL, light emitting elements ED (e.g., ED1, ED2, ED3, ED4, and ED5), and connection electrodes CNE (e.g., CNE1, CNE2, CNE3, CNE4, and CCE) disposed in a pixel PX of the display device 10. FIGS. 6 to 8 illustrate arrangements of the electrodes RME, and the light emitting element ED and the connection electrode CNE separately with respect to the bank layer BNL shown in a pixel PX of FIG. 5.

Referring to FIGS. 5 to 8, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, embodiments are not limited thereto, and the sub-pixels SPXn may emit light of the same color. In an embodiment, each of the sub-pixels SPXn may emit blue light. Although it is illustrated in the drawing that a pixel PX includes three sub-pixels SPXn, embodiments are not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, embodiments are not limited thereto. In some embodiments, the emission areas EMA of the sub-pixels SPXn may have different sizes according to a color or wavelength band of light emitted from the light emitting element ED disposed in each sub-pixel.

The pixel PX may further include sub-regions SA1 and SA2 disposed in the non-emission area. The sub-regions SA1 and SA2 may include a first sub-region SA1 disposed to the upper side, which is a side in the first direction DR1, of the emission area EMA, and a second sub-region SA2 disposed to the lower side, which is another side in the first direction DR1, of the emission area EMA. The emission area EMA and the sub-regions SA1 and SA2 may be alternately arranged in the first direction DR1 according to the arrangement of the pixels PX, and the first sub-region SA1 or the second sub-region SA2 may be disposed between different emission areas EMA spaced apart from each other in the first direction DR1. For example, the emission areas EMA may be repeatedly arranged in the first direction DR1 with the first sub-region SA1 or the second sub-region SA2 interposed therebetween. The emission areas EMA may be repeatedly disposed in the second direction DR2, and the first sub-region SA1 and the second sub-region SA2 may extend in the second direction DR2. The first sub-region SA1 and the second sub-region SA2 may be defined according to the arrangement of electrode contact holes CTD and CTS to be described below. However, embodiments are not limited thereto, and the emission areas EMA and the sub-regions SA1 and SA2 in the pixels PX may have a different arrangement from that of FIG. 5.

The emission area EMA may be disposed for each sub-pixel SPXn, and the sub-regions SA1 and SA2 may be disposed across the sub-pixels SPXn. As will be described below, the emission area EMA and the sub-regions SA1 and SA2 may be divided by the bank layer BNL, and the bank layer BNL may surround the emission area EMA for each sub-pixel SPXn so as to include the emission area EMA, and the sub-regions SA1 and SA2 may be disposed so as not to be divided between different sub-pixels SPXn.

The first sub-region SA1 and the second sub-region SA2 may be shared by the pixels PX adjacent in the first direction DR1. In the pixel PX shown in FIG. 5, the first sub-region SA1 may be disposed to the upper side of the emission area EMA. In pixels PX adjacent to the pixel PX shown in FIG. 5 in the first direction DR1, the second sub-region SA2 may be disposed to the upper side of the emission area EMA. In the sub-regions SA1 and SA2, the light emitting element ED may not be disposed, so that light may not be emitted therefrom, but a part of the electrode RME disposed in each sub-pixel SPXn may be disposed.

The display device 10 may include the electrodes RME1 and RME2, the barrier walls BP1 and BP2, the bank layer BNL, the light emitting elements ED, and the connection electrodes CNE.

The barrier walls BP1 and BP2 may be disposed in the emission area EMA of each sub-pixel SPXn. The barrier walls BP1 and BP2 may extend substantially in the first direction DR1 and may be be spaced apart from each other in the second direction DR2.

For example, the barrier walls BP1 and BP2 may include a first barrier wall BP1 and a second barrier wall BP2 spaced apart from each other in the second direction DR2 in the emission area EMA of each sub-pixel SPXn. The first barrier wall BP1 may include a first sub-barrier wall SBP1 and a second sub-barrier wall SBP2 spaced apart from each other in the first direction DR1. The first sub-barrier wall SBP1 and the second sub-barrier wall SBP2 may be disposed at the center area of the emission area EMA, and the second barrier walls BP2 may be disposed with the first barrier wall BP1 interposed therebetween to be spaced apart from the first barrier wall BP1. The first barrier wall BP1 and the second barrier wall BP2 may be alternately disposed along the second direction DR2 and may be disposed in an island-shaped pattern in the display area DPA. The light emitting elements ED may be arranged between the first barrier wall BP1 and the second barrier wall BP2.

The width of the second barrier wall BP2 measured in the second direction DR2 may be larger than those of the first sub-barrier wall SBP1 and the second sub-barrier wall SBP2 of the first barrier wall BP1. In case that the first sub-barrier wall SBP1 and the second sub-barrier wall SBP2 of the first barrier wall BP1 are disposed in the emission area EMA of each sub-pixel SPXn, the second barrier wall BP2 may be disposed across the emission areas EMA of the two sub-pixels SPXn adjacent in the second direction DR2. The second barrier wall BP2 may be disposed across the boundary area between the sub-pixels SPXn adjacent in the second direction DR2, and may overlap the bank layer BNL to be described below. However, embodiments are not limited thereto, and the first barrier wall BP1 and the second barrier wall BP2 may have the same width.

The length in the first direction DR1 of the first sub-barrier wall SBP1 and the second sub-barrier wall SBP2 of the first barrier wall BP1 may be smaller than that of the second barrier wall BP2, and the length of the second barrier wall BP2 in the first direction DR1 may be greater than the length in the first direction DR1 of the emission area EMA surrounded by the bank layer BNL. Each of the first sub-barrier wall SBP1 and the second sub-barrier wall SBP2 may have a length in the first direction DR1 smaller than the length in the first direction DR1 of the emission area EMA surrounded by the bank layer BNL, and may overlap (e.g., partially overlap) the bank layer BNL. The second barrier wall BP2 may overlap a part of the bank layer BNL extending in the second direction DR2. However, embodiments are not limited thereto, and the barrier walls BP1 and BP2 may be integral with the bank layer BNL or may be spaced apart from a part of the bank layer BNL extending in the second direction DR2. For example, the length of the barrier walls BP1 and BP2 in the first direction DR1 may be equal to or smaller than the length in the first direction DR1 of the emission area EMA surrounded by the bank layer BNL.

The electrodes RME1 and RME2 may be disposed in a shape extending in a direction in each sub-pixel SPXn. The electrodes RME1 and RME2 may each extend in the first direction DR1 to be disposed in the emission area EMA and the sub-regions SA1 and SA2 of the sub-pixel SPXn, and they may be spaced apart from each other in the second direction DR2. The electrodes RME1 and RME2 may be connected (e.g., electrically connected) to the light emitting element ED to be described below. However, embodiments are not limited thereto, and the electrodes RME may not be electrically connected to the light emitting element ED.

The display device 10 may include a first electrode RME1 disposed at the center area of each sub-pixel SPXn and a second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes. The first electrode RME1 may be disposed at the center area of the sub-pixel SPXn and may extend in the first direction DR1 to be disposed across the emission area EMA and the sub-regions SA1 and SA2. The second electrode RME2 may be spaced apart from the first electrode RME1 in the second direction DR2 in the emission area EMA, and may be disposed across different sub-pixels SPXn adjacent in the second direction DR2. The second electrode RME2 may also extend in the first direction DR1 to be disposed across the emission area EMA and the sub-regions SA1 and SA2. The first electrode RME1 and the second electrode RME2 may each extend in the first direction DR1 in the display area DPA to be disposed across the pixels PX and the sub-pixels SPXn.

A part of the first electrode RME1 disposed in the emission area EMA may be disposed on the first sub-barrier wall SBP1 and the second sub-barrier wall SBP2 of the first barrier wall BP1. The first electrode RME1 may have a shape in which a width measured in the second direction DR2 varies according to positions, and a part of the first electrode RME1 overlapping the sub-barrier walls SBP1 and SBP2 of the first barrier wall BP1 in at least the emission area EMA may have a width greater than those of the sub-barrier walls SBP1 and SBP2. The first electrode RME1 may also be disposed at a portion where the first sub-barrier wall SBP1 and the second sub-barrier wall SBP2 are spaced apart from each other in the second direction DR2.

According to an embodiment, the first electrode RME1 may include a first electrode contact portion CTE1 disposed in the first sub-region SA1. The first electrode RME1 may extend in the first direction DR1 and may be partially bent in the first sub-region SA1, and the first electrode contact portion CTE1 may be disposed at the end portion of the bent portion. As will be described below, the first electrode RME1 may be connected (e.g., electrically connected) to the first voltage line VL1 through a first electrode contact hole CTD formed in the first electrode contact portion CTE1. The first electrodes RME1 disposed in the pixels PX adjacent in the first direction DR1 may be connected to each other through a portion branched in the first direction DR1 from the bent portion.

The second electrode RME2 may have a shape substantially extending in the first direction DR1 and may include an extension portion having a large width in the emission area EMA. The extension portion of the second electrode RME2 may be disposed across two sub-pixels SPXn adjacent in the second direction DR2 and overlap the bank layer BNL. For example, a stem portion connected to the extension portion and extending in the first direction DR1 may be disposed in the first sub-region SA1 and the second sub-region SA2. In the pixels PXs adjacent in the first direction DR1, the stem portions of the second electrodes RME may be connected to each other.

The extension portion of the second electrode RME2 may be disposed on sides (e.g., opposite sides) in the second direction DR2 from the center area of the sub-pixel SPXn, and may be disposed on the second barrier wall BP2. The extension portion of the second electrode RME2 may be disposed across the emission areas EMA of the sub-pixels SPXn adjacent in the second direction DR2, and may overlap an area between the sub-pixels SPXn.

The second electrodes RME2 may extend in the first direction DR1 and may be disposed between the sub-pixels SPXn adjacent in the second direction DR2. The second electrodes RME2 may include different electrode lines RM1 and RM2 disposed to (or adjacent to) sides (e.g., opposite sides) of the first electrode RME1 in the second direction DR2. The second electrodes RME2 may include a first electrode line RM1 and a second electrode line RM2 different from each other, which may be alternately disposed in the second direction DR2. For example, with respect to the first sub-pixel SPX1, the second electrode RME2 disposed to the left side of the first electrode RME1 may be the first electrode line RM1, and the second electrode RME2 disposed to the right side of the first electrode RME1 may be the second electrode line RM2. In the second sub-pixel SPX2, the second electrode RME2 disposed to the left side of the first electrode RME1 may be the second electrode line RM2, and the second electrode RME2 disposed to (or adjacent to) the right side of the first electrode RME1 may be the first electrode line RM1. In the third sub-pixel SPX3, the second electrode RME2 disposed to the left side of the first electrode RME1 may be the first electrode line RM1, and the second electrode RME2 disposed to (or adjacent to) the right side of the first electrode RME1 may be the second electrode line RM2.

The width of the first electrode RME1 measured in the second direction DR2 may be smaller than the width of the extension portion of the second electrode RME2. The first electrode RME1 may have a width greater than those of the sub-barrier walls SBP1 and SBP2 of the first barrier wall BP1 and may overlap sides (e.g., opposite sides) of each of the sub-barrier walls SBP1 and SBP2 of the the first barrier wall BP1. The extension portion of the second electrode RME2 may have a width greater than that of the first electrode RME1, and may overlap sides (e.g., opposite sides) of the second barrier wall BP2. A distance between the sub-barrier wall SBP1, SBP2 of the first barrier wall BP1 and the second barrier wall BP2 may be greater than a distance between the first electrode RME1 and the second electrode RME2.

The extension portion of the second electrode RME2 may be disposed across different sub-pixels SPXn, similarly to the second barrier wall BP2. The first electrode RME1 may correspond to the emission area EMA of any a sub-pixel SPXn, in case that the extension portion of the second electrode RME2 may be disposed across the emission areas EMA of adjacent sub-pixels SPXn. The sub-pixels SPXn adjacent in the second direction DR2 may share the extension portion of the second electrode RME2.

The second electrode RME2 may include an electrode hole RMH formed in the extension portion. As the extension portion of the second electrode RME2 covers the second barrier wall BP2, in the manufacturing process of the display device 10, a discharge path for a gas released from layers disposed under the second electrode RME2 may be required. The second electrode RME2 may include the electrode hole RMH formed in a portion overlapping the bank layer BNL, and gases generated in the layers disposed under the second electrode RME2 may be discharged therethrough.

According to an embodiment, the second electrode RME2 may include a second electrode contact portion CTE2 disposed in the second sub-region SA2. The second electrode RME2 may extend in the first direction DR1 to be disposed across the pixels PX, and the second electrode contact portion CTE2 may be disposed in the second sub-region SA2. As will be described below, the second electrode RME2 may be connected (e.g., electrically connected) to the second voltage line VL2 through a second electrode contact hole CTS formed in the second electrode contact portion CTE2.

The first electrode RME1 and the second electrode RME2 may be spaced apart from each other in the emission area EMA to form a path or an alignment area in which the light emitting elements ED are arranged. For example, in the first sub-pixel SPX1, a first path (or a first space) facing the second electrode RME2 of the first electrode line RM1 may be formed to the left side of the first electrode RME1, and a second path (or a second space) facing the second electrode RME2 of the second electrode line RM2 may be formed to the right side of the first electrode RME1. The light emitting elements ED, which will be described below, may be disposed in the yarn paths (e.g., spaces) formed by the first electrode RME1 and the second electrode RME2 and may be connected (e.g., electrically connected) to the connection electrodes CNE.

In the display device 10 according to an embodiment, a larger number of light emitting elements ED may be arranged in the emission area EMA including an area where the first electrode RME1 and the second electrode RME2 face each other, in addition to the path (or space) formed by the electrodes RME1 and RME2 facing each other in the second direction DR2. For example, in the display device 10, the first electrode RME1 may include a recess C (see FIG. 11) formed on a side of the first electrode RME1 facing the second electrode RME2, the second electrode RME2 may include a protrusion PE (see FIG. 11) inserted into the recess C, and the light emitting element ED may be disposed on the recess C of the first electrode RME1 and the protrusion PE of the second electrode RME2. The display device 10 may have an electrode structure in which the light emitting elements ED may be arranged between the yarn paths (e.g., spaces) formed by the electrodes RME1 and RME2 spaced apart in the second direction DR2, and the number of light emitting elements ED disposed per unit area and luminance per unit area may be improved. A more detailed description of the structures of the first electrode RME1 and the second electrode RME2 will be provided below with reference to other drawings.

The bank layer BNL may surround the sub-pixels SPXn, the emission area EMA, and the sub-regions SA1 and SA2. The bank layer BNL may be disposed at the boundary area between the sub-pixels SPXn adjacent in the first direction DR1 and the second direction DR2, and may also be disposed at the boundary area between the emission area EMA and the sub-regions SA1 and SA2. The sub-pixels SPXn, the emission area EMA, and the sub-regions SA1 and SA2 of the display device 10 may be the areas distinguished by the arrangement of the bank layer BNL. The gaps between the sub-pixels SPXn, the emission areas EMA, and the sub-regions SA1 and SA2 may vary according to the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundary areas between the sub-pixels SPXn to delimit the neighboring sub-pixels SPXn. For example, the bank layer BNL may surround the emission area EMA disposed in each sub-pixel SPXn and to surround the sub-regions SA1 and SA2 extending in the second direction DR2.

The light emitting elements ED may be arranged in the emission area EMA. The light emitting elements ED may be disposed between the barrier walls BP1 and BP2 and may be spaced apart from each other in the first direction DR1 or the second direction DR2. In an embodiment, the light emitting elements ED may have a shape extending in a direction, and end portions of the light emitting elements ED may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, embodiments are not limited thereto, and the light emitting element ED may extend in the second direction DR2 or in a direction oblique to the second direction DR2.

End portions (e.g., opposite end portions) of the light emitting element ED may be disposed on the first electrode RME1 and the second electrode RME2. The light emitting elements ED may be classified into different light emitting elements ED1, ED2, ED3, ED4, and ED5 according to their arrangement positions in the emission area EMA and the common connection electrodes CCE in contact with end portions of the light emitting elements ED.

For example, in the first sub-pixel SPX1, the light emitting elements ED may include a first light emitting element ED1, a second light emitting element ED2, and a third light emitting element ED3 disposed on the second electrode RME2 of the first electrode line RM1 and the first electrode RME1, and a fourth light emitting element ED4 and a fifth light emitting element ED5 disposed on the second electrode RME2 of the second electrode line RM2 and the first electrode RME1. The first light emitting element ED1 and the fifth light emitting element ED5 may be disposed on the upper side of the emission area EMA, and the third light emitting element ED3 and the fourth light emitting element ED4 may be disposed on the lower side of the emission area EMA. The second light emitting element ED2 may be disposed at the center area of the emission area EMA and may be disposed on the recess C of the first electrode RME1 and the protrusion PE of the second electrode RME2.

The first to fifth light emitting elements ED1 to ED5 may be defined according to their arrangement positions in the emission area EMA, but may also be defined according to arrangement or contact relationship with a connection electrode CNE to be described below. For example, the first light emitting element ED1 and the second light emitting element ED2 may be distinguished from each other since the first and second light emitting elements ED1 and ED2 are disposed at different positions in the emission area EMA. However, embodiments are not limited thereto, and the first and second light emitting elements ED1 and ED2 may be distinguished from each other since the connection electrodes in contact with end portions of the first and second light emitting elements ED1 and ED2 are different.

The first light emitting element ED1 and the fifth light emitting element ED5 may be respectively disposed between the first sub-barrier wall SBP1 and different second barrier walls BP2. The second light emitting element ED2 may be disposed between the first sub-barrier wall SBP1 and the second sub-barrier wall SBP2. The third light emitting element ED3 and the fourth light emitting element ED4 may be respectively disposed between the second sub-barrier wall SBP2 and different second barrier walls BP2. The first light emitting element ED1 and the third light emitting element ED3 may be disposed to the left side of the sub-barrier walls SBP1 and SBP2 of the first barrier wall BP1, and the fourth light emitting element ED4 and the fifth light emitting element ED5 may be disposed to the right side of the sub-barrier walls SBP1 and SBP2 of the first barrier wall BP1.

The connection electrodes CNE (e.g., CNE1, CNE2, CNE3, CNE4, and CCE) may be disposed on the electrodes RME and the barrier walls BP1 and BP2. The connection electrodes CNE may have a shape at least partially extending in a direction similarly to the electrodes RME, and may be spaced apart from each other. The connection electrodes CNE may be in contact with the light emitting element ED and may be connected (e.g., electrically connected) to a conductive layer thereunder.

The connection electrode CNE may include a first connection electrode CNE1, a second connection electrode CNE2, a third connection electrode CNE3, and a fourth connection electrode CNE4 disposed to correspond to each sub-pixel SPXn, and further, a common connection electrode CCE disposed across the pixels PX or sub-pixels SPXn.

The first connection electrode CNE1 may have a shape extending in the first direction DR1 and may be disposed on the first electrode RME1. The first connection electrode CNE1 may overlap the sub-barrier wall SBP1, SBP2 of the first barrier wall BP1 and the first electrode RME1, and may extend from the emission area EMA in the first direction DR1 to the sub-region SA1, SA2. In the first sub-pixel SPX1 and the third sub-pixel SPX3, the first connection electrode CNE1 may overlap the first electrode RME1 and the first sub-barrier wall SBP1 on the upper side of the emission area EMA and may be disposed across the emission area EMA and the first sub-region SA1. In the second sub-pixel SPX2, the first connection electrode CNE1 may overlap the first electrode RME1 and the second sub-barrier wall SBP2 on the lower side of the emission area EMA, and may be disposed across the emission area EMA and the second sub-region SA2. The first connection electrode CNE1 disposed in the first sub-pixel SPX1 and the third sub-pixel SPX3 may be in contact with a conductive layer thereunder through a first contact hole CT1 in the first sub-region SA1, and the first connection electrode CNE1 disposed in the second sub-pixel SPX2 may be in contact with a conductive layer thereunder through a third contact hole CT3 in the second sub-region SA2.

The arrangement of the connection electrodes CNE may be substantially the same in the first sub-pixel SPX1 and the third sub-pixel SPX3, but in the second sub-pixel SPX2, the arrangement of the connection electrodes CNE may be different from other sub-pixels. For example, the arrangement of the connection electrodes CNE in the first sub-pixel SPX1 and the second sub-pixel SPX2 may have laterally and vertically symmetric structures. A position of the first connection electrode CNE1 in the first sub-pixel SPX1 and the third sub-pixel SPX3 may be different from a position of the first connection electrode CNE1 in the second sub-pixel SPX2. Hereinafter, the arrangement of the other connection electrodes CNE in the first sub-pixel SPX1 will be described below, and the arrangement of the connection electrodes CNE in the second sub-pixel SPX2 will be described below.

The second connection electrode CNE2 may be spaced apart from the first connection electrode CNE1 and may be disposed across the second electrode RME2 of the first electrode line RM1 and the first electrode RME1. The second connection electrode CNE2 may include a first contact portion CTP1 spaced apart from the first connection electrode CNE1 in the second direction DR2, a second contact portion CTP2 spaced apart from the first connection electrode CNE1 in the first direction DR1, and a first connection portion CBP1 that connects the first contact portion CTP1 to the second contact portion CTP2. The second connection electrode CNE2 may be substantially disposed in the emission area EMA, but a part of the second connection electrode CNE2 may overlap the bank layer BNL The first contact portion CTP1 of the second connection electrode CNE2 may include an extension portion disposed in the emission area EMA and a bypass portion disposed on the bank layer BNL. The first contact portion CTP1 may prevent disconnection due to a lower stepped portion by including the bypass portion connected to the upper and lower sides of the extension portion.

The third connection electrode CNE3 may be spaced apart from the second connection electrode CNE2 and disposed on the second electrode RME2 of the first electrode line RM1. The third connection electrode CNE3 may be spaced apart from the second contact portion CTP2 of the second connection electrode CNE2 in the second direction DR2, and may be spaced apart from the first contact portion CTP1 in the first direction DR1. Similarly to the first contact portion CTP1, the third connection electrode CNE3 may include an extension portion extending in the first direction DR1 in the emission area EMA and a bypass portion on the bank layer BNL. The third connection electrode CNE3 may prevent disconnection due to a lower stepped portion by including the bypass portion connected to the upper and lower sides of the extension portion.

The fourth connection electrode CNE4 may be spaced apart from the first connection electrode CNE1 and the second connection electrode CNE2 and may be disposed across the second electrode RME2 of the second electrode line RM2 and the first electrode RME1. The fourth connection electrode CNE4 may include a third contact portion CTP3 spaced apart from the second contact portion CTP2 of the second connection electrode CNE2 in the second direction DR2, a fourth contact portion CTP4 spaced apart from the first connection electrode CNE1 in the second direction DR2, and a second connection portion CBP2 that connects the third contact portion CTP3 to the fourth contact portion CTP4. The fourth connection electrode CNE4 may be substantially disposed in the emission area EMA, but a part of the fourth connection electrode CNE4 may overlap the bank layer BNL.

The third contact portion CTP3 of the fourth connection electrode CNE4 may include an extension portion disposed in the emission area EMA and a bypass portion disposed on the bank layer BNL. The third contact portion CTP3 may prevent disconnection due to a lower stepped portion by including the bypass portion connected to the upper and lower sides of the extension portion.

The second connection electrode CNE2 and the fourth connection electrode CNE4 may be disposed across two different electrodes. Unlike the first connection electrode CNE1 and the third connection electrode CNE3, the second connection electrode CNE2 and the fourth connection electrode CNE4 may substantially extend in the first direction DR1 but may be partially bent in a diagonal direction. Accordingly, the second connection electrode CNE2 and the fourth connection electrode CNE4 may be disposed across the first electrode RME1 and the second electrode RME2 spaced apart in the second direction DR2.

According to an embodiment, the second contact portion CTP2 of the second connection electrode CNE2 and the fourth contact portion CTP4 of the fourth connection electrode CNE4 may have different widths in the second direction DR2. As will be described below, the second contact portion CTP2 of the second connection electrode CNE2 may be in contact with the light emitting elements (e.g., the third light emitting element ED3 and the fourth light emitting element ED4) disposed in different yarn paths (e.g., spaces), in case that the fourth contact portion CTP4 of the fourth connection electrode CNE4 may be in contact with the light emitting element (e.g., the fifth light emitting element ED5) disposed in a yarn path (e.g., space). The shapes of the second connection electrode CNE2 and the fourth connection electrode CNE4 may be substantially the same, but the widths of the second contact portion CTP2 and the fourth contact portion CTP4 may be different from each other.

The above-described arrangement of the first to fourth connection electrodes CNE1, CNE2, CNE3, and CNE4 may correspond to the first sub-pixel SPX1 and the third sub-pixel SPX3. In the first sub-pixel SPX1 and the third sub-pixel SPX3, the first connection electrode CNE1 may be disposed on the upper side from the center area of the emission area EMA, and the third connection electrode CNE3 may be disposed on the lower left side from the center area of the emission area EMA. The first contact portion CTP1 of the second connection electrode CNE2 may be disposed to the left side of the first connection electrode CNE1, and the second contact portion CTP2 of the second connection electrode CNE2 may be disposed to the lower side of the first connection electrode CNE1. The third contact portion CTP3 of the fourth connection electrode CNE4 may be disposed to the right side of the second contact portion CTP2 of the second connection electrode CNE2, and the fourth contact portion CTP4 of the fourth connection electrode CNE4 may be disposed to the right side of the first connection electrode CNE1.

The arrangement of the first to fourth connection electrodes CNE1, CNE2, CNE3, and CNE4 in the second sub-pixel SPX2 may be different from that described above. In the second sub-pixel SPX2, the first connection electrode CNE1 may be disposed on the lower side from the center area of the emission area EMA, and the third connection electrode CNE3 may be disposed on the upper right side from the center area of the emission area EMA. The first contact portion CTP1 of the second connection electrode CNE2 may be disposed to the right side of the first connection electrode CNE1, and the second contact portion CTP2 of the second connection electrode CNE2 may be disposed to the upper side of the first connection electrode CNE1. The third contact portion CTP3 of the fourth connection electrode CNE4 may be disposed to the left side of the second contact portion CTP2 of the second connection electrode CNE2, and the fourth contact portion CTP4 of the fourth connection electrode CNE4 may be disposed to the left side of the first connection electrode CNE1.

The common connection electrode CCE may be disposed across the sub-pixels SPXn. The common connection electrode CCE may include a contact portion disposed opposite to the fourth contact portion CTP4 of the fourth connection electrode CNE4 in the second direction DR2 in each of the sub-pixels SPXn, and may include a connection portion connecting the contact portions. In the first sub-pixel SPX1 and the third sub-pixel SPX3, the contact portion of the common connection electrode CCE may be disposed in the upper right side of the emission area EMA, and in the second sub-pixel SPX2, the contact portion of the common connection electrode CCE may be disposed in the lower left side of the emission area EMA. For example, the contact portion of the common connection electrode CCE may have a shape including a bypass portion, similarly to the first contact portion CTP1 of the second connection electrode CNE2.

The connection portion of the common connection electrode CCE may bypass the other connection electrodes CNE1, CNE2, CNE3, and CNE4 to connect the contact portions disposed in the sub-pixels SPXn to each other. The common connection electrode CCE may be in contact with a conductive layer thereunder through a second contact hole CT2 in the second sub-region SA2.

As will be described below, end portions (e.g., opposite end portions) of the light emitting elements ED may be distinguished from each other, and may be in contact with different connection electrodes CNE. For example, a first end portion of the first light emitting element ED1 may overlap the first connection electrode CNE1, and a second end portion of the first light emitting element ED1 may overlap the first contact portion CTP1 of the second connection electrode CNE2. A first end portion of the second light emitting element ED2 may overlap the first connection portion CBP1 of the second connection electrode CNE2, and a second end portion of the second light emitting element ED2 may overlap the second connection portion CBP2 of the fourth connection electrode CNE4. A first end portion of the third light emitting element ED3 may overlap the second contact portion CTP2 of the second connection electrode CNE2, and a second end portion of the third light emitting element ED3 may overlap the third connection electrode CNE3. A first end portion of the fourth light emitting element ED4 may overlap the second contact portion CTP2 of the second connection electrode CNE2, and a second end portion of the fourth light emitting element ED4 may overlap the third contact portion CTP3 of the fourth connection electrode CNE4. A first end portion of the fifth light emitting element ED5 may overlap the fourth contact portion CTP4 of the fourth connection electrode CNE4, and a second end portion of the fifth light emitting element ED5 may overlap the contact portion of the common connection electrode CCE. The first to fifth light emitting elements ED1 to ED5 may have end portions respectively in contact with the connection electrodes CNE overlapping the first to fifth light emitting elements ED1 to ED5, and may be connected (e.g., electrically connected) to each other.

For example, the first light emitting element ED1 may be connected in series to the second light emitting element ED2, the third light emitting element ED3, and the fourth light emitting element ED4. The second light emitting element ED2, the third light emitting element ED3, and the fourth light emitting element ED4 may be connected to each other in parallel. The second light emitting element ED2 and the fourth light emitting element ED4 may be connected in series to the fifth light emitting element ED5. In the display device 10, the light emitting elements ED disposed in each sub-pixel SPXn may be connected in series or in parallel to each other to increase the amount of light emitted per unit area.

The display device 10 may further include insulating layers PAS1, PAS2, and PAS3 disposed between the electrodes RME1 and RME2, the light emitting elements ED, and the connection electrodes CNE. The electrodes RME1 and RME2, the light emitting elements ED, and the connection electrodes CNE1, CNE2, and CNE3 may overlap each other, but may be only partially in contact with each other by the insulating layers PAS1, PAS2, and PAS3 disposed therebetween.

Figure 9:
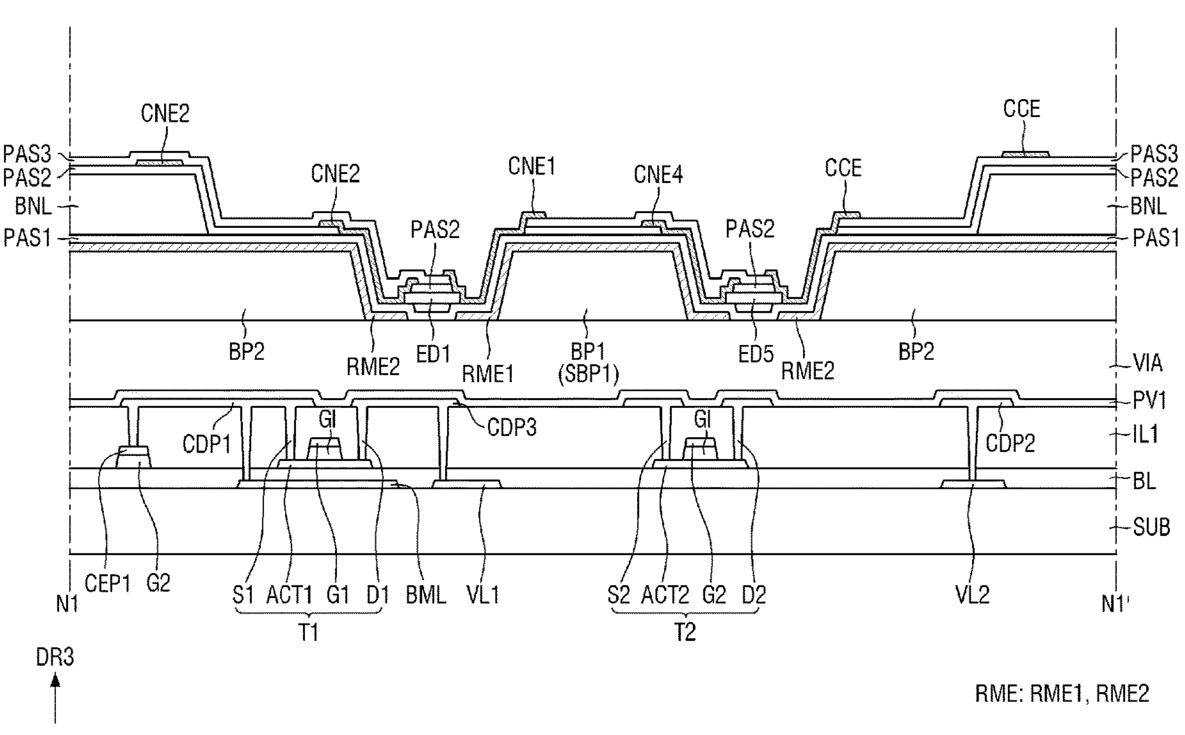
FIG. 9 is a schematic cross-sectional view taken along line N1-N1' of FIG. 5.
Figure 10:
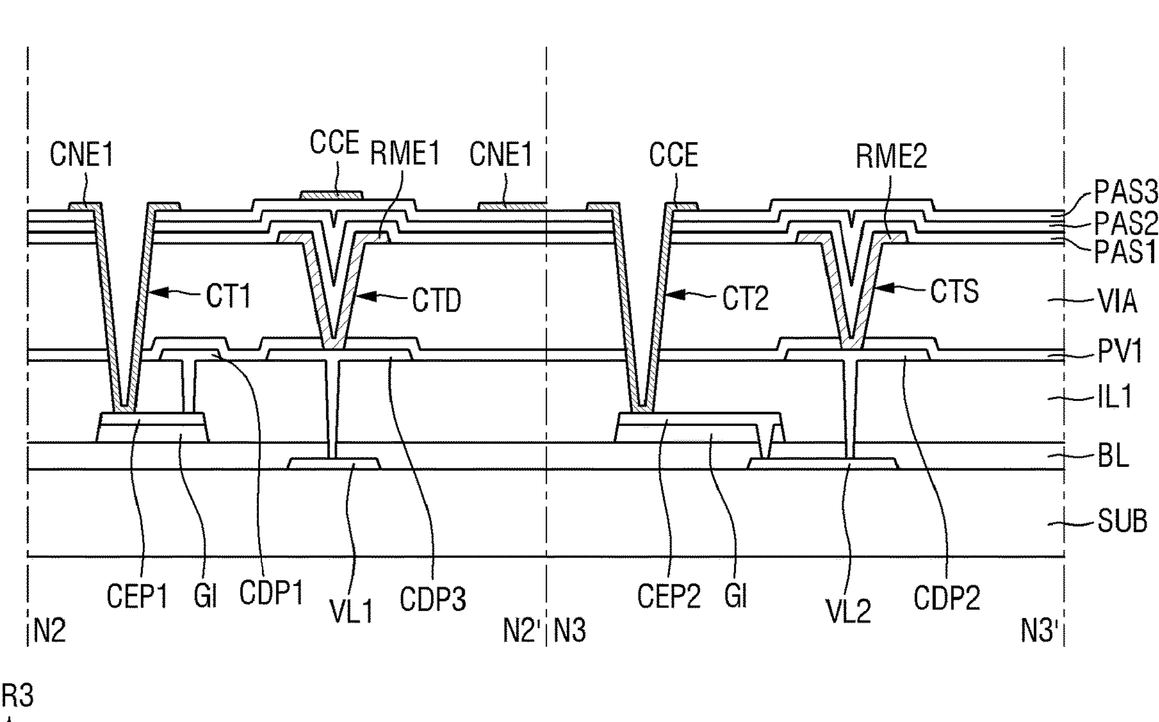
FIG. 10 is a schematic cross-sectional view taken along lines N2-N2' and N3-N3' of FIG. 5.

FIG. 9 is a schematic cross-sectional view taken along line N1-N1' of FIG. 5. FIG. 10 is a schematic cross-sectional view taken along lines N2-N2' and N3-N3' of FIG. 5.

FIG. 9 illustrates a cross section crossing end portions (e.g., opposite end portions) of the first light emitting element ED1 and the fifth light emitting element ED5 disposed in the first sub-pixel SPX1. FIG. 10 illustrates a cross section crossing the electrode contact holes CTD and CTS and the contact holes CT1 and CT2.

Referring to FIGS. 5 to 10, the display device 10 may include a first substrate SUB and a semiconductor layer, conductive layers, and insulating layers disposed on the first substrate SUB. For example, the display device 10 may include the electrodes RME, the light emitting element ED, and the connection electrodes CNE.

The first substrate SUB may be an insulating substrate. The first substrate SUB may be made of an insulating material such as glass, quartz, or polymer resin. Further, the first substrate SUB may be a rigid substrate, but may be a flexible substrate which may be bent, folded or rolled. The first substrate SUB may include the display area DPA and the non-display area NDA surrounding the display area DPA, and the display area DPA may include the emission area EMA and the sub-regions SA1 and SA2 that are parts of the non-emission area.

The first conductive layer may include a lower metal layer BML, a first voltage line VL1, and a second voltage line VL2. The lower metal layer BML may overlap an active layer ACT1 of a first transistor T1. The lower metal layer BML may prevent light from entering (or being transmitted to) the first active layer ACT1 of the first transistor T1, or may be connected (e.g., electrically connected) to the first active layer ACT1 to stabilize electrical characteristics of the first transistor T1. In another example, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be connected (e.g., electrically connected) to the first the first transistor T1 through a conductive pattern layer (e.g., a third conductive pattern layer CDP3) of a second conductive layer. The second voltage line VL2 may be connected (e.g., electrically connected) to the second electrode RME2 through a conductive pattern layer (e.g., a second conductive pattern layer CDP2) of a third conductive layer.

Although the drawing illustrates that the first voltage line VL1 and the second voltage line VL2 are disposed on a first conductive layer, embodiments are not limited thereto. In some embodiments, the first voltage line VL1 and the second voltage line VL2 may be disposed on the third conductive layer and may be connected (e.g., directly electrically connected) to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, may have a flat upper surface, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may overlap (e.g., partially overlap) a first gate electrode G1 and a second gate electrode G2 of a second conductive layer to be described below, respectively.

The semiconductor layer may include polycrystalline silicon, monocrystalline silicon, oxide semiconductor, and the like. In an embodiment, the semiconductor layer may include polycrystalline silicon, or an oxide semiconductor. The oxide semiconductor may include indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that a first transistor T1 and a second transistor T2 are disposed in the sub-pixel SPXn of the display device 10, embodiments are not limited thereto and the display device 10 may include a larger number of transistors.

The first gate insulating layer GI may be disposed on the semiconductor layer. The first gate insulating layer GI may function as a gate insulating layer of each of the transistors T1 and T2. Although it is illustrated in the drawing that the first gate insulating layer GI is patterned together with the gate electrodes G1 and G2 of the second conductive layer and partially disposed between the second conductive layer and the active layers ACT1 and ACT2 of the semiconductor layer, embodiments are not limited thereto. In some embodiments, the first gate insulating layer GI may be disposed (e.g., entirely disposed) on the buffer layer BL with covering the semiconductor layer.

The second conductive layer may be disposed on the first gate insulating layer GI. The second conductive layer may include the first gate electrode G1 of the first transistor T1, the second gate electrode G2 of the second transistor T2, and first and second bridge electrodes CEP1 and CEP2. The first gate electrode G1 may overlap the channel region of the first active layer ACT1 in a third direction DR3 (e.g., a thickness direction), and the second gate electrode G2 may overlap the channel region of the second active layer ACT2 in the third direction DR3 (e.g., the thickness direction). For example, the second conductive layer may further include an electrode of the storage capacitor.

The first bridge electrode CEP1 may be connected to a first conductive pattern layer CDP1 of the third conductive layer. The first bridge electrode CEP1 may be connected (e.g., electrically connected) to the first transistor T1 and the first voltage line VL1 through the first conductive pattern layer CDP1. The first connection electrode CNE1 of each sub-pixel SPXn may be connected (e.g., electrically connected) to the first transistor T1 through the first bridge electrode CEP1. The second bridge electrode CEP1 may be connected to the second voltage line VL2 of the first conductive layer. The common connection electrode CCE may be connected (e.g., electrically connected) to the second voltage line VL2 through the second bridge electrode CEP2.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer ILL The third conductive layer may include conductive pattern layers CDP1, CDP2, and CDP3, and source electrodes S1 and S2 and drain electrodes D1 and D2 of the respective transistors T1 and T2. Some of the conductive pattern layers CDP1, CDP2, and CDP3 may connect (e.g., electrically connect) conductive layers or semiconductor layers of different layers to each other and may function as source/drain electrodes of the transistors T1 and T2.

The first conductive pattern layer CDP1 may be in contact with the first active layer ACT1 of the first transistor T1 and the first bridge electrode CEP1 through a contact hole penetrating the first interlayer insulating layer ILL The first conductive pattern layer CDP1 may be in contact with the lower metal layer BML, through a contact hole penetrating the first interlayer insulating layer IL1 and the buffer layer BL. The first conductive pattern layer CDP1 may function as a first source electrode S1 of the first transistor T1. The first conductive pattern layer CDP1 may be connected (e.g., electrically connected) to the first connection electrode CNE1. The first transistor T1 may transmit the first power voltage applied from the first voltage line VL1 to the first connection electrode CNE1.

The second conductive pattern layer CDP2 may be in contact with the second voltage line VL2 through a contact hole penetrating the first interlayer insulating layer IL1 and the buffer layer BL. The second conductive pattern layer CDP2 may be connected to the second electrode RME2, and the second voltage line VL2 may transmit the second power voltage to the second electrode RME2 through the second conductive pattern layer CDP2.

The third conductive pattern layer CDP3 may be in contact with the first voltage line VL1 through a contact hole penetrating the first interlayer insulating layer IL1 and the buffer layer BL. Further, the third conductive pattern layer CDP3 may be in contact with the first active layer ACT1 of the first transistor T1 through the contact hole penetrating the first interlayer insulating layer ILL The third conductive pattern layer CDP3 may connect (e.g., electrically connect) the first voltage line VL1 to the first transistor T1 and may function as the first drain electrode D1 of the first transistor T1. Further, the third conductive pattern layer CDP3 may be in contact with the first voltage line VL1 through a contact hole penetrating the first interlayer insulating layer IL1 and the buffer layer BL. The third conductive pattern layer CDP3 may be connected (e.g., electrically connected) to the first electrode RME1, and the first voltage line VL1 may transmit the first power voltage to the first electrode RME1 through the third conductive pattern layer CDP3.

The second source electrode S2 and the second drain electrode D2 may be in contact with the second active layer ACT2 of the second transistor T2 through the contact holes penetrating the first interlayer insulating layer IL1.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer ILL and the first passivation layer PV1 described above may be formed of inorganic layers stacked in an alternating manner. For example, the buffer layer BL, the first gate insulating layer GI, the first interlayer insulating layer ILL and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, embodiments are not limited thereto, and the buffer layer BL, the first gate insulating layer GI, the first interlayer insulating layer IL1, and the first passivation layer PV1 may be formed as a single inorganic layer containing the above-described insulating material. Further, in some embodiments, the first interlayer insulating layer IL1 may be made of an organic insulating material such as polyimide (PI) or the like.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface (e.g., the upper surface). However, in some embodiments, the via layer VIA may be omitted.

The display device 10 may include the barrier walls BP1 and BP2, the electrodes RME and the bank layer BNL, and the light emitting elements ED and the connection electrodes CNE, as a display element layer disposed on the via layer VIA. For example, the display device 10 may include the insulating layers PAS1, PAS2, and PASS.

The barrier walls BP1 and BP2 may be disposed on the via layer VIA. For example, the barrier walls BP1 and BP2 may be disposed (e.g., directly disposed) on the via layer VIA, and may have a structure in which at least a portion of the barrier walls BP1 and BP2 protrudes with respect to the top surface (e.g., the upper surface) of the via layer VIA. As described above, the first barrier wall BP1 and the second barrier wall BP2 may be spaced apart from each other, and the first barrier wall BP1 may be disposed between the second barrier walls BP2. The first barrier wall BP1 may include the sub-barrier walls SBP1 and SBP2 spaced apart from each other in the first direction DR1. The first barrier wall BP1 shown in FIG. 9 may be the first sub-barrier wall SBP1. The barrier walls BP1 and BP2 may have side surfaces that are inclined or curved at a certain curvature, and light emitted from the light emitting elements ED1 and ED2 may be reflected from the electrodes RME disposed on the barrier walls BP1 and BP2 to be emitted in an upward direction of the via layer VIA. In another example, the barrier walls BP1 and BP2 may have a shape, e.g., a semicircular or semi-elliptical shape, in which the outer surface is curved at a certain curvature in cross-sectional view. The barrier walls BP1, BP2, and BP3 may include an organic insulating material such as polyimide (PI), but embodiments are not limited thereto.

The electrodes RME may be disposed on the barrier walls BP1 and BP2 and the via layer VIA. For example, each of the electrodes RME may be disposed (e.g., partially disposed) on at least an inclined side surface of the barrier walls BP1 and BP2. The first electrode RME1 may cover the sub-barrier walls SBP1 and SBP2 of the first barrier wall BP1, and the second electrode RME2 may cover the side surface of the second barrier wall BP2. The width of the first electrode RME1 may be greater than those of the sub-barrier walls SBP1 and SBP2 of the first barrier wall BP1, and the width of the extension portion of the second electrode RME2 may be smaller than that of the second barrier wall BP2. A distance between the electrodes RME spaced apart from each other in the second direction DR2 may be smaller than a distance between the barrier walls BP1 and BP2. The electrodes RME may each have at least a portion disposed (e.g., directly disposed) on the via layer VIA, so that they may be disposed on the same plane.

The light emitting element ED disposed between the barrier walls BP1 and BP2 may emit light toward end portions (e.g., opposite end portions) of the light emitting element ED, and the emitted light may be directed toward the electrodes RME disposed on the barrier walls BP1 and BP2. The electrodes RME may have a structure in which portions of the electrodes RME disposed on the barrier walls BP1 and BP2 may reflect the light emitted from the light emitting element ED. The electrodes RME may cover at least one side surface of the barrier walls BP1 and BP2, to reflect light emitted from the light emitting element ED.

The electrode contact portions CTE1 and CTE2 of the first electrode RME1 and the second electrode RME2 disposed in the sub-regions SA1 and SA2 may be in direct contact with the third conductive layer through the electrode contact holes CTD and CTS. For example, in the first sub-region SA1, the first electrode contact hole CTD may be formed in a region overlapping the first electrode contact portion CTE1, and the first electrode contact portion CTE1 of the first electrode RME1 may be in contact with the third conductive pattern layer CDP3 through the first electrode contact hole CTD penetrating the via layer VIA and the first passivation layer PV1. In the second sub-region SA2, the second electrode contact hole CTS may be formed in a region overlapping the second electrode contact portion CTE2, and the second electrode contact portion CTE2 of the second electrode RME2 may be in contact with the second conductive pattern layer CDP2 through the second electrode contact hole CTS penetrating the via layer VIA and the first passivation layer PV1. The first electrode RME1 and the second electrode RME2 may be connected (e.g., electrically connected) to the first voltage line VL1 and the second voltage line VL2 through the third conductive pattern layer CDP3 and the second conductive pattern layer CDP2, respectively.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. In another example, the electrodes RME may have a structure in which a metal layer such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

Embodiments are not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as a single layer including the transparent conductive material and the metal layer. For example, each electrode RME may have a stacked structure of ITO/Ag/ITO, ITO/Ag/IZO, ITO/Ag/ITZO/IZO, or the like. The electrodes RME may be connected (e.g., electrically connected) to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the electrodes RME. The first insulating layer PAS1 may protect the electrodes RME and insulate electrodes RME different from each other. The first insulating layer PAS1 may cover the electrodes RME before the bank layer BNL is formed, so that the electrodes RME may be protected from being damaged in a process of forming the bank layer BNL. For example, the first insulating layer PAS1 may prevent the light emitting element ED disposed thereon from being damaged by direct contact with other members.

In an embodiment, the first insulating layer PAS1 may have stepped portions such that the top surface (e.g., the upper surface) of the first insulating layer PAS1 may be partially recessed between the electrodes RME spaced apart in the second direction DR2. The light emitting element ED may be disposed on the top surface (e.g., the upper surface) of the first insulating layer PAS1, where the stepped portions are formed, and thus a space may remain between the light emitting element ED and the first insulating layer PAS1.

The first insulating layer PAS1 may include the contact holes CT1, CT2, and CT3. The contact holes CT1, CT2, and CT3 of the first insulating layer PAS1 may overlap different electrodes RME in the sub-regions SA1 and SA2. For example, the contact holes CT1, CT2, and CT3 may include the first contact holes CT1 disposed in the first sub-region SA1 to overlap the first connection electrodes CNE1 of the first sub-pixel SPX1 and the third sub-pixel SPX3, the second contact hole CT2 disposed in the second sub-region SA2 to overlap the common connection electrode CCE, and the third contact hole CT3 disposed in the second sub-region SA2 to overlap the first connection electrode CNE1 of the second sub-pixel SPX2.

The first to third contact holes CT1, CT2, and CT3 may penetrate the first insulating layer PAS1, the via layer VIA, the first passivation layer PV1, and the first interlayer insulating layer IL1 to expose a part of the top surfaces (e.g., the upper surfaces) of the bridge electrodes CEP1 and CEP2 thereunder. The first contact hole CT1 and the third contact hole CT3 may expose a part of the top surface (e.g., the upper surface) of the first bridge electrode CEP1, and the second contact hole CT2 may expose a part of the top surface (e.g., the upper surface) of the second bridge electrode CEP2. The first to third contact holes CT1, CT2, and CT3 may also penetrate the second insulating layer PAS2 and the third insulating layer PAS3 to be described below.

The bank layer BNL may be disposed on the first insulating layer PAS1. The bank layer BNL may include portions extending in the first direction DR1 and the second direction DR2, and may surround the sub-pixels SPXn. The bank layer BNL may surround the emission area EMA and the sub-regions SA1 and SA2 of each sub-pixel SPXn to divide them, and may surround the outermost edge of the display area DPA to divide the display area DPA from the non-display area NDA. A part of the bank layer BNL extending in the first direction DR1 may divide the emission areas EMA adjacent in the second direction DR2, and a part of the bank layer BNL extending in the second direction DR2 may divide the emission area EMA and the sub-regions SA1 and SA2 adjacent to each other. A part of the bank layer BNL extending in the first direction DR1 may be disposed on the second barrier wall BP2.

Similarly to the barrier walls BP1 and BP2, the bank layer BNL may have a certain height. In some embodiments, the top surface (e.g., the upper surface) of the bank layer BNL may be higher than that of the barrier walls BP1 and BP2, and the thickness of the bank layer BNL may be equal to or greater than that of the barrier walls BP1 and BP2. The bank layer BNL may prevent ink from overflowing to adjacent sub-pixels SPXn in an inkjet printing process during the manufacturing process of the display device 10. Similarly to the barrier walls BP1 and BP2, the bank layer BNL may include an organic insulating material such as polyimide. However, embodiments are not limited thereto, and the bank layer BNL may include a material different from those of the barrier walls BP1 and BP2.

The light emitting elements ED may be arranged in the emission area EMA. The light emitting elements ED may be disposed on the first insulating layer PAS1 between the barrier walls BP1 and BP2. The light emitting element ED may be disposed so that an extension direction of the light emitting element ED may be parallel with the top surface (e.g., the upper surface) of the first substrate SUB. As will be described below, the light emitting element ED may include semiconductor layers arranged along a direction in which the light emitting element ED extends, and the semiconductor layers may be sequentially arranged along the direction parallel with the top surface (e.g., the upper surface) of the first substrate SUB. However, embodiments are not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands according to a material constituting the semiconductor layer. However, embodiments are not limited thereto, and the light emitting elements ED arranged in each sub-pixel SPXn may include the semiconductor layer of the same material and emit light of the same color.

The light emitting elements ED may be disposed on different electrodes RME between different barrier walls BP1 and BP2. The first light emitting element ED1 and the fifth light emitting element ED5 may be disposed between the first sub-barrier wall SBP1 of the first barrier wall BP1 and the second barrier wall BP2, so that end portions of the light emitting elements ED may be disposed on the first electrode RME1 and the second electrode RME2. The first light emitting element ED1 and the fifth light emitting element ED5 may be disposed in different yarn paths (e.g., spaces), and end portions of the first and fifth light emitting elements ED1 and ED5 may be disposed on different second electrodes RME2.

For example, the third light emitting element ED3 and the fourth light emitting element ED4 may be disposed between the second sub-barrier wall SBP2 of the first barrier wall BP1 and the second barrier wall BP2, so that end portions of the third and fourth light emitting elements ED3 and ED4 may be disposed on the first electrode RME1 and the second electrode RME2. The third light emitting element ED3 and the fourth light emitting element ED4 may be disposed in different yarn paths (e.g., spaces), and end portions of the third and fourth light emitting elements ED3 and ED4 may be disposed on different second electrodes RME2. The first light emitting element ED1 and the third light emitting element ED3 may be disposed to the right side of the first barrier wall BP1 in the emission area EMA, and the fourth light emitting element ED4 and the fifth light emitting element ED5 may be disposed to the left side of the first barrier wall BP1. The second light emitting element ED2 may be disposed on the protrusion PE of the second electrode RME2 and the first electrode RME1, between the first sub-barrier wall SBP1 and the second sub-barrier wall SBP2.

The light emitting elements ED may be connected (e.g., electrically connected) to the conductive layers under the electrode RME and the via layer VIA by contact with the connection electrodes CNE, and may emit light of a specific wavelength band by being applied with an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED with extending in the first direction DR1 between the barrier walls BP1 and BP2. The pattern portion may surround (e.g., partially surround) the outer surface of the light emitting element ED, and may not cover sides (e.g., opposite sides) or end portions (e.g., opposite end portions) of the light emitting element ED. The pattern portion may form a linear or island-like pattern in each sub-pixel SPXn in a plan view. The pattern portion of the second insulating layer PAS2 may protect the light emitting element ED and may fix the light emitting elements ED in a manufacturing process of the display device 10. Further, the second insulating layer PAS2 may fill the space between the light emitting element ED and the second insulating layer PAS2 thereunder. A part of the second insulating layer PAS2 may be disposed on the bank layer BNL and in the sub-regions SA.

The second insulating layer PAS2 may include the first to third contact holes CT1, CT2, and CT3, similarly to the first insulating layer PAS1. A description thereof is substantially the same as described above.

The connection electrodes CNE may be disposed on the electrodes RME and the barrier walls BP1 and BP2. The connection electrodes CNE may be divided into a connection electrode of a first connection electrode layer disposed between the second insulating layer PAS2 and the third insulating layer PAS3, and a connection electrode of a second connection electrode layer disposed on the third insulating layer PAS3. The second connection electrode CNE2 and the fourth connection electrode CNE4 may be connection electrodes of the first connection electrode layer, and the first connection electrode CNE1, the third connection electrode CNE3, and the common connection electrode CCE may be connection electrodes of the second connection electrode layer.

The first connection electrode CNE1 may be disposed on the first electrode RME1 and the first sub-barrier wall SBP1 of the first barrier wall BP1. The first contact portion CTP1 of the second connection electrode CNE2 may be disposed on the second electrode RME2 and the second barrier wall BP2, and the second contact portion CTP2 of the second connection electrode CNE2 may be disposed on the first electrode RME1 and the second sub-barrier wall SBP2. The third connection electrode CNE3 may be disposed on the second electrode RME2 and the second barrier wall BP2. The third contact portion CTP3 of the fourth connection electrode CNE4 may be disposed on the second electrode RME2 and the second barrier wall BP2, and the fourth contact portion CTP4 of the fourth connection electrode CNE4 may be disposed on the first electrode RME1 and the first sub-barrier wall SBP1. The contact portions of the common connection electrode CCE disposed in the emission area EMA may be disposed on the second electrode RME2 and the second barrier wall BP2, and portions connecting the contact portions of the common connection electrode CCE may be disposed in the sub-regions SA1 and SA2 or on the bank layer BNL. A description of the planar arrangement of each connection electrode CNE may be substantially the same as described above with reference to FIGS. 5 to 8.

The connection electrodes CNE may be disposed on the second insulating layer PAS2 and may be in contact with the light emitting elements ED. The first connection electrode CNE1 may be in contact with the first end portion of the first light emitting element ED1. The second connection electrode CNE2 may be in contact with the second end portion of the first light emitting element ED1, and the first end portions of the second light emitting element ED2, the third light emitting elements ED3, and the fourth light emitting element ED4. The first contact portion CTP1 of the second connection electrode CNE2 may be in contact with the second end portion of the first light emitting element ED1, the first connection portion CBP1 of the second connection electrode CNE2 may be in contact with the first end portion of the second light emitting element ED2, and the second contact portion CTP2 of the second connection electrode CNE2 may be in contact with the first end portions of the third light emitting element ED3 and the fourth light emitting element ED4.

The third connection electrode CNE3 may be in contact with the second end portion of the third light emitting element ED3. The fourth connection electrode CNE4 may be in contact with the second end portions of the second light emitting element ED2 and the fourth light emitting element ED4, and the first end portion of the fifth light emitting element ED5. The third contact portion CTP3 of the fourth connection electrode CNE4 may be in contact with the second end portion of the fourth light emitting element ED4, the second connection portion CBP2 may be in contact with the second end portion of the second light emitting element ED2, and the fourth contact portion CTP4 may be in contact with the first end portion of the fifth light emitting element ED5. The contact portion of the common connection electrode CCE may be in contact with the second end portion of the fifth light emitting element ED5.

End portions (e.g., opposite end portions) of each of the first light emitting element ED1, the third light emitting element ED3, the fourth light emitting element ED4, and the fifth light emitting element ED5 may be in contact with the connection electrodes disposed on different layers. End portions (e.g., opposite end portions) of the second light emitting element ED2 may be in contact with the connection electrodes disposed on the same layer. The first light emitting element ED1, the third light emitting element ED3, the fourth light emitting element ED4, and the fifth light emitting element ED5 may be disposed in a path (or space) between the first barrier wall BP1 and the second barrier wall BP2, in case that the second light emitting element ED2 may be disposed on the recess C of the first electrode RME1 and the protrusion PE of the second electrode RME2, between the first sub-barrier wall SBP1 and the second sub-barrier wall SBP2. The arrangement position of the second light emitting element ED2 may be different from those of other light emitting elements ED, and the connection electrodes in contact with end portions (e.g., opposite end portions) of the second light emitting element ED2 may be disposed on the same layer. A detailed description thereof will be provided below.

The first connection electrode CNE1 and the common connection electrode CCE may be disposed across the emission area EMA and the sub-regions SA1 and SA2, and may be in contact with the bridge electrodes CEP1 and CEP2, respectively, through the contact holes CT1, CT2, and CT3 formed in the sub-regions SA1 and SA2. The first connection electrode CNE1 may be in contact with the first bridge electrode CEP1 through the first contact hole CT1 or the third contact hole CT3 disposed in the first sub-region SA1, and the common connection electrode CCE may be in contact with the second bridge electrode CEP2 through the second contact hole CT2 disposed in the second sub-region SA2. The second connection electrode CNE2, the third connection electrode CNE3, and the fourth connection electrode CNE4 may not be directly connected to the conductive layer thereunder.

The first connection electrode CNE1 may be connected (e.g., electrically connected) to the first transistor T1 through the first bridge electrode CEP1, so that the first power voltage may be transmitted to the first connection electrode CNE1, and the common connection electrode CCE may be connected (e.g., electrically connected) to the second voltage line VL2 through the second bridge electrode CEP2, so that the second power voltage may be applied to the common connection electrode CCE. The light emitting elements ED may emit light by the power voltages transmitted through the first connection electrode CNE1 and the common connection electrode CCE.

The first connection electrode CNE1 and the common connection electrode CCE may be first type connection electrodes connected (e.g., directly connected) to the second conductive layer, and the second connection electrode CNE2, the third connection electrode CNE3, and the fourth connection electrode CNE4 may be second type connection electrodes that are not connected to the conductive layer thereunder. The second type connection electrode may be in contact with the light emitting elements ED without being connected to the conductive layer thereunder and may constitute an electrical connection circuit of the light emitting elements ED together with other connection electrodes CNE.

The connection electrodes CNE may include a conductive material. For example, the connection electrodes CNE may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 may be disposed on the connection electrodes of the second connection electrode layer and the second insulating layer PAS2. The third insulating layer PAS3 may be disposed (e.g., entirely disposed) on the second insulating layer PAS2 to cover the second connection electrode CNE2 and the fourth connection electrode CNE4, and the first connection electrode CNE1, the third connection electrode CNE3, and the common connection electrode CCE may be disposed on the third insulating layer PAS3. The third insulating layer PAS3 may be disposed (e.g., entirely disposed) on the via layer VIA except for a region where the first connection electrode CNE1, the third connection electrode CNE3, and the common connection electrode CCE are disposed. The third insulating layer PAS3 may insulate the connection electrodes of the first connection electrode layer from the connection electrodes of the second connection electrode layer so that the connection electrodes of the first and second connection electrode layers may not be in direct contact with each other.

According to an embodiment, the third insulating layer PAS3 may include the contact holes CT1, CT2, and CT3. A description thereof is substantially the same as described above. The first to third contact holes CT1, CT2, and CT3 may penetrate the first to third insulating layers PAS1, PAS2, and PAS3.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may contain an inorganic insulating material, or the first insulating layer PAS1 and the third insulating layer PAS3 may contain an inorganic insulating material and the second insulating layer PAS2 may contain an organic insulating material. Each or at least one of the first insulating layer PAS1, the second insulating layer PAS2, and the third insulating layer PAS3 may have a structure in which insulating layers are stacked alternately or repeatedly. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In another example, some of them may be made of the same material and some of them may be made of different materials.

Figure 11:
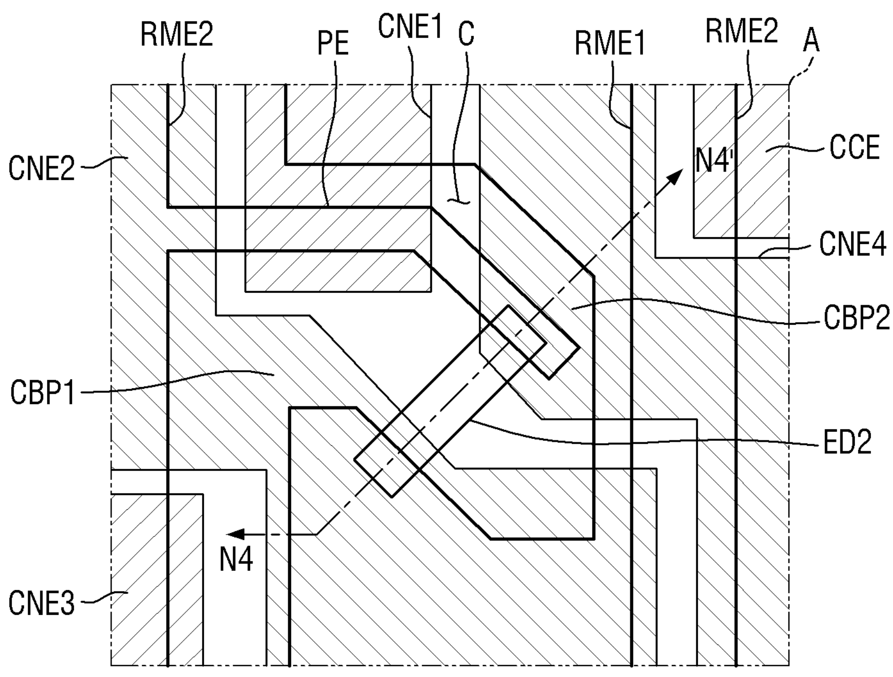
FIG. 11 is a schematic enlarged view of a part A of FIG. 5.
Figure 11:
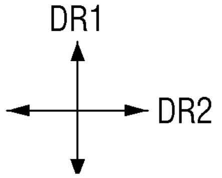
Figure 12:
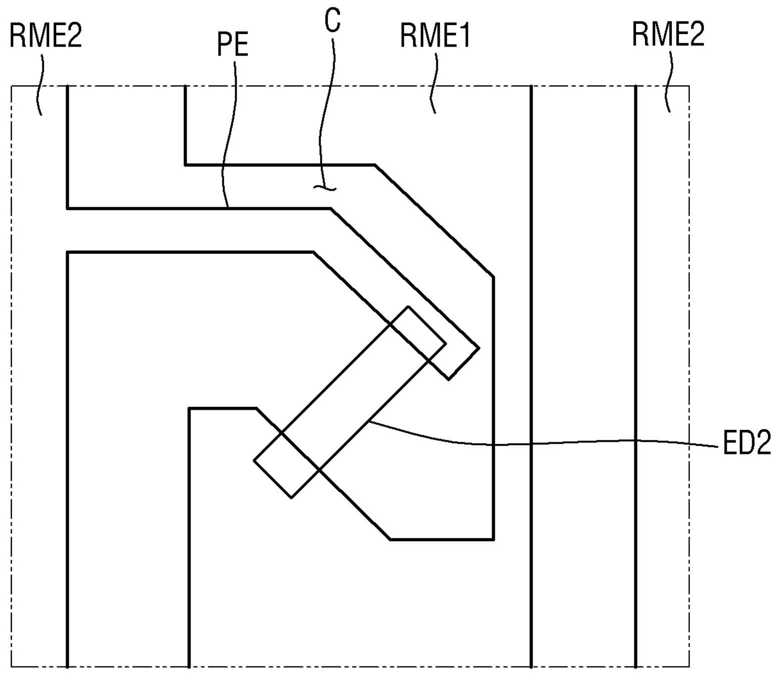
FIG. 12 may be a plan view illustrating electrodes and a light emitting element of FIG. 11.
Figure 12:
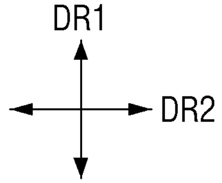
Figure 13:
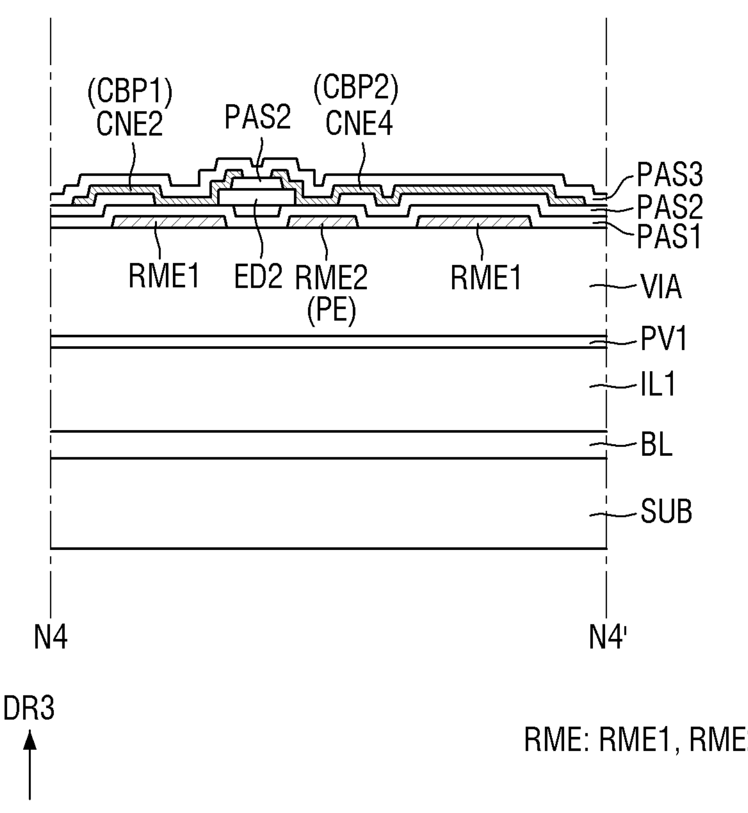
FIG. 13 is a schematic cross-sectional view taken along line N4-N4' of FIG. 11.

FIG. 11 is a schematic enlarged view of a part A of FIG. 5. FIG. 12 may be a plan view illustrating electrodes and a light emitting element of FIG. 11. FIG. 13 is a schematic cross-sectional view taken along line N4-N4' of FIG. 11.

Referring to FIGS. 11 to 13, according to an embodiment, the first electrode RME1 may include the recess C formed by recessing a side of the first electrode RME1 facing the second electrode RME2, and the second electrode RME2 may include the protrusion PE inserted into the recess C of the first electrode RME1. The protrusion PE of the second electrode RME2 may be disposed in the recess C of the first electrode RME1 to face the sidewall of the recess C of the first electrode RME1.

The first electrode RME1 may include the recess C formed in a portion disposed in the emission area EMA. The recess C may be disposed adjacent to the center area of the emission area EMA. The recess C may be formed on a side of the first electrode RME1 facing the second electrodes RME2. The recess C of the first electrode RME1 may be formed on the left side of the first electrode RME1 facing the second electrode RME2 disposed to the left side of the first electrode RME1. In the first sub-pixel SPX1 and the third sub-pixel SPX3, the recess C may be formed on a side of the first electrode RME1 facing the second electrode RME2 of the first electrode line RM1. In the second sub-pixel SPX2, the recess C may be formed on a side of the first electrode RME1 facing the second electrode RME2 of the second electrode line RM2. The recess C may be formed on the left side of the first electrode RME1 in each sub-pixel SPXn.

The second electrode RME2 may include the protrusion PE formed on a side of the second electrode RME2 corresponding to the recess C of the first electrode RME1. The protrusion PE of the second electrode RME2 may be inserted into the recess C. The protrusion PE may face the sides of the recess C within the recess C. The recess C of the first electrode RME1 and the protrusion PE of the second electrode RME2 may face each other and may be spaced apart from each other, and the second light emitting element ED2 may be disposed thereon.

In an embodiment, the recess C of the first electrode RME1 may include a portion (e.g., a first recess portion) recessed in the second direction DR2, and a portion (e.g., a second recess portion) bent therefrom and recessed in a diagonal direction. The protrusion PE of the second electrode RME2 may include a portion (e.g., a first protrusion portion) extending in the second direction DR2, and a portion (e.g., a second protrusion portion) bent therefrom to extend in the diagonal direction. The second light emitting element ED2 may be disposed on the diagonally recessed portion of the recess C of the first electrode RME1 and the diagonally extended portion of the protrusion PE of the second electrode RME2. The first light emitting element ED1, the third light emitting element ED3, the fourth light emitting element ED4, and the fifth light emitting element ED5 may each be disposed on portions of the first electrode RME1 and the second electrode RME2 extending in the first direction DR1, and the extension direction of each of the light emitting elements ED may be substantially parallel with the second direction DR2. For example, the second light emitting element ED2 may be disposed on the side of the diagonally recessed portion of the recess C of the first electrode RME1 and the diagonally extended portion of the protrusion PE of the second electrode RME2, and the extension direction of the light emitting element ED may be substantially parallel with a diagonal direction. The second light emitting element ED2 may have a different orientation direction from those of other light emitting elements ED.

For example, the first light emitting element ED1 and the third light emitting element ED3 may be arranged in parallel and may be spaced apart from each other in the first direction DR1, and the fourth light emitting element ED4 and the fifth light emitting element ED5 may also be arranged in parallel and may be spaced apart from each other in the first direction DR1. The first light emitting element ED1 and the fifth light emitting element ED5 may be arranged in parallel and may be spaced apart from each other in the second direction DR2, and the third light emitting element ED3 and the fourth light emitting element ED4 may also be arranged in parallel and may be spaced apart from each other in the second direction DR2. For example, the second light emitting element ED2 may not be parallel to other light emitting elements in the first direction DR1 and the second direction DR2. Since the second light emitting element ED2 is disposed in the recess C of the first electrode RME1, the second light emitting element ED2 may be arranged not to be parallel to at least the first light emitting element ED1, the third light emitting element ED3, the fourth light emitting element ED4, and the fifth light emitting element ED5 in the first direction DR1. However, embodiments are not limited thereto. In some cases, light emitting elements arranged in parallel to the second light emitting element ED2 in the second direction DR2 may be formed.

End portions (e.g., opposite end portions) of the second light emitting element ED2 may be in contact with the connection electrode CNE of the first connection electrode layer. The first end portion of the second light emitting element ED2 may be in contact with the first connection portion CBP1 of the second connection electrode CNE2, and the second end portion of the second light emitting element ED2 may be in contact with the second connection portion CBP2 of the fourth connection electrode CNE4. For example, end portions (e.g., opposite end portions) of the second light emitting element ED2 may be in contact with the connection electrode disposed on the same layer, and the second connection electrode CNE2 and the fourth connection electrode CNE4 may be spaced apart from each other on the second light emitting element ED2.

The shapes and positions of the recess C of the first electrode RME1 and the protrusion PE of the second electrode RME2, and the orientation direction of the second light emitting element ED2 may correspond to the shapes of the second connection electrode CNE2 and the fourth connection electrode CNE4. The second connection electrode CNE2 and the fourth connection electrode CNE4 may substantially extend in the first direction DR1, but may be partially bent to be disposed across different electrodes RME1 and RME2. The second connection electrode CNE2 and the fourth connection electrode CNE4 may include connection portions CBP1 and CBP2 extending in a diagonal direction, respectively. The first light emitting element ED1, the third light emitting element ED3, the fourth light emitting element ED4, and the fifth light emitting element ED5 may each be disposed in a path (or space) in which the first electrode RME1 and the second electrode RME2 are spaced apart from each other in the second direction DR2, and a part of the connection electrodes CNE in contact with end portions (e.g., opposite end portions) of the first to fifth light emitting element ED1, ED2, ED3, ED4, and ED5 may have a shape substantially extending in the first direction DR1. The first light emitting element ED1, the third light emitting element ED3, the fourth light emitting element ED4, and the fifth light emitting element ED5 may be oriented in the second direction DR2 so as to be in contact with portions of the connection electrodes CNE extending in the first direction DR1. For example, the second light emitting element ED2 may be in contact with the connection portions CBP1 and CBP2 of the second and fourth connection electrodes CNE2 and CNE4 extending in the diagonal direction. The second light emitting element ED2 may be oriented in a diagonal direction to be in contact with the connection portions CBP1 and CBP2 extending in the diagonal direction.

The display device 10 according to an embodiment may include a light emitting element (e.g., the second light emitting element) disposed to correspond to a diagonally extended portion of the connection electrodes CNE constituting the series connection of the light emitting elements ED. The light emitting element may be additionally disposed in the emission area EMA in addition to the light emitting elements ED disposed on the electrodes RME1 and RME2 spaced apart in the second direction DR2, so that the number of light emitting elements ED disposed per unit area of each sub-pixel SPXn may increase, thereby improving the luminance in the display device 10. The first electrode RME1 and the second electrode RME2 of the display device 10 may include the recess C and the protrusion PE corresponding to additional light emitting elements so that the light emitting elements ED may be further disposed thereon.

As the second light emitting element ED2, which is an additional light emitting element ED, is disposed on the first electrode RME1 and the second electrode RME2, the second contact portion CTP2 of the second connection electrode CNE2 and the fourth contact portion CTP4 of the fourth connection electrode CNE4 may have different shapes. In an embodiment, the second contact portion CTP2 of the second connection electrode CNE2 may have a width greater than that of the fourth contact portion CTP4 of the fourth connection electrode CNE4 in the second direction DR2, and may be in contact with the light emitting elements ED disposed in different yarn paths (e.g., different spaces). The second contact portion CTP2 of the second connection electrode CNE2 may be in contact with the first end portion of the third light emitting element ED3 and the first end portion of the fourth light emitting element ED4, and the fourth contact portion CTP4 of the fourth connection electrode CNE4 may be in contact with the first end portion of the fifth light emitting element ED5. As the second connection electrode CNE2 and the fourth connection electrode CNE4 are brought into contact with the second light emitting element ED2, an electrical connection path through the third light emitting element ED3, the third connection electrode CNE3, and the fourth light emitting element ED4 may be changed.

In case that the second contact portion CTP2 of the second connection electrode CNE2 is brought into contact with only the first end portion of the third light emitting element ED3, and the third connection electrode CNE3 may be brought into contact with the third light emitting element ED3 and the fourth light emitting element ED4, most of an electrical signal applied to the second connection electrode CNE2 may flow to the fourth connection electrode CNE4 through the second light emitting element ED2. For example, since it may be impossible for the third light emitting element ED3 and the fourth light emitting element ED4 to emit light, in order to prevent this problem, the second contact portion CTP2 of the second connection electrode CNE2 may be in contact with both the first end portion of the third light emitting element ED3 and the first end portion of the fourth light emitting element ED4. Accordingly, the second light emitting element ED2, the third light emitting element ED3, and the fourth light emitting element ED4 may be connected (e.g., electrically connected) in parallel to each other, and they may be connected in series to the first light emitting element ED1 and the fifth light emitting element ED5.

Figure 14:
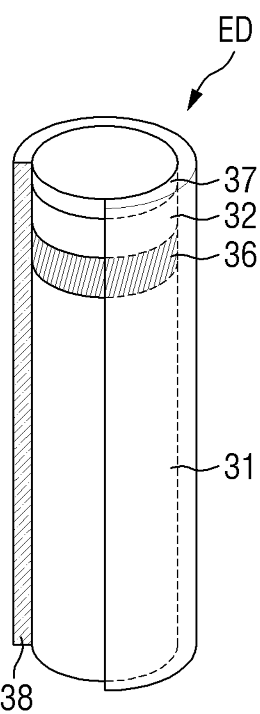
FIG. 14 is a schematic schematic view of a light emitting element according to an embodiment.

FIG. 14 is a schematic view of a light emitting element according to an embodiment.

Referring to FIG. 14, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity in case that an electric field is formed in a specific direction between two electrodes (e.g., opposite electrodes) facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type impurity (e.g., a p-type dopant or an n-type dopant). The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are formed as a single layer, embodiments are not limited thereto. According to the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN and SLs doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, embodiments are not limited thereto, and the electrode layer 37 may be a Schottky connection electrode. The light emitting element ED may include at least an electrode layer 37. The light emitting element ED may include one or more electrode layers 37, but embodiments are not limited thereto, and the electrode layer 37 may be omitted.

In the display device 10, in case that the light emitting element ED is connected (e.g., electrically connected) to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may surround the outer surfaces of the semiconductor layers and electrode layers described above. For example, the insulating film 38 may surround at least the outer surface of the light emitting layer 36, and may be formed to expose end portions (e.g., opposite end portions) of the light emitting element ED in the longitudinal direction. Further, in cross-sectional view, the insulating film 38 may have a top surface (e.g., an upper surface), which is rounded in a region adjacent to at least an end portion of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but embodiments are not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode to which an electrical signal is transmitted is in direct contact with the light emitting element ED. For example, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, various embodiments of the display device 10 will be described with reference to other drawings.

Figure 15:
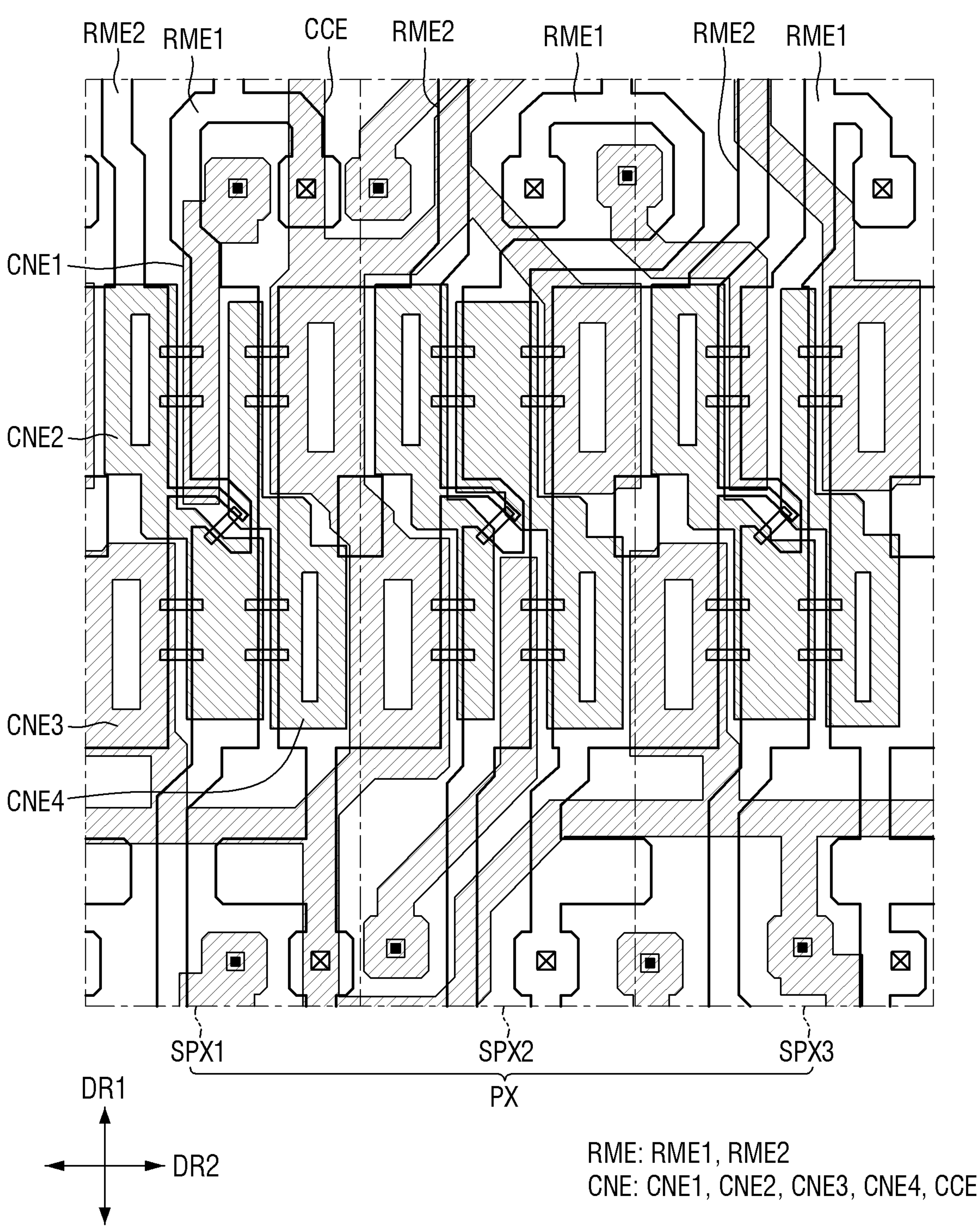
FIG. 15 is a schematic plan view illustrating a pixel of a display device according to an embodiment.
Figure 16:
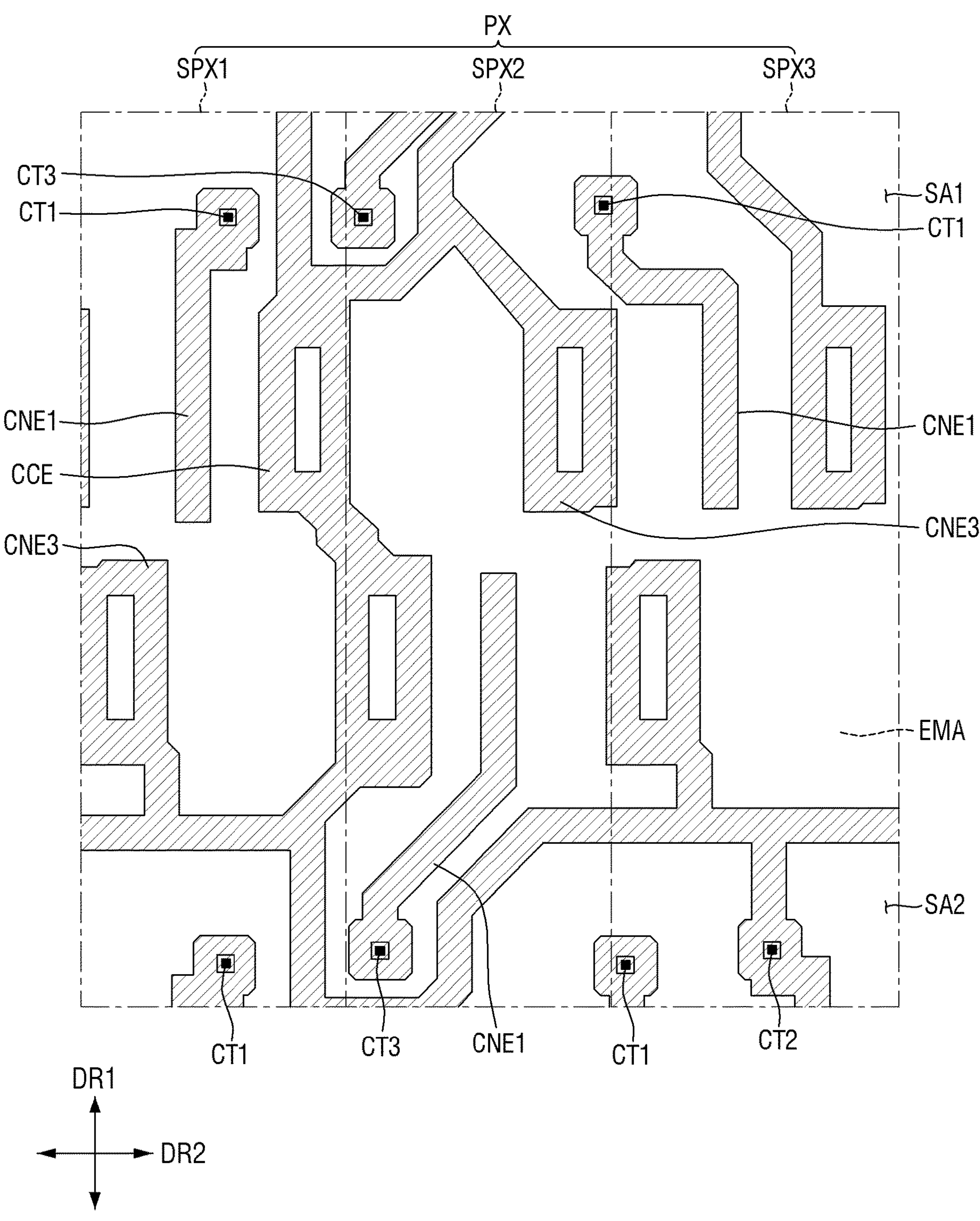
FIG. 16 is a schematic plan view illustrating an arrangement of connection electrodes of a second connection electrode layer disposed in a pixel of FIG. 15.

FIG. 15 is a schematic plan view illustrating a pixel of a display device according to an embodiment. FIG. 16 is a schematic plan view illustrating an arrangement of connection electrodes of a second connection electrode layer disposed in a pixel of FIG. 15.

Referring to FIGS. 15 and 16, in the display device 10 according to an embodiment, the third connection electrode CNE3 of the second connection electrode layer may be connected (e.g., directly connected) to the common connection electrode CCE. In the embodiment of FIGS. 5 to 8, the third connection electrode CNE3 may be in contact with the second end portion of the third light emitting element ED3 and may not be in contact with other connection electrodes CNE and the conductive layer. Referring to FIG. 15, in the display device 10 according to an embodiment, the third connection electrode CNE3 may be integrally connected to (or integral with) the common connection electrode CCE, and accordingly, may be connected (e.g., electrically connected) to the second voltage line VL2 through the second contact hole CT2.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:

a first electrode extending in a first direction;

a second electrode extending in the first direction and spaced apart from the first electrode in a second direction intersecting the first direction; and a plurality of light emitting elements disposed on the first electrode and the second electrode, wherein the first electrode comprises a recess formed by partially recessing a side of the first electrode facing the second electrode, the second electrode comprises a protrusion disposed on a side of the second electrode facing the first electrode and inserted into the recess, the plurality of light emitting elements comprise:

a first light emitting element disposed on portions of the first electrode and the second electrode extending in the first direction, and a second light emitting element disposed on the recess of the first electrode and disposed on the protrusion of the second electrode, the recess of the first electrode comprises:

a first recess portion recessed in the second direction, and a second recess portion recessed in a diagonal direction intersecting the first direction and the second direction, and the protrusion of the second electrode comprises:

a first protrusion portion protruding in the second direction, and a second protrusion portion protruding in the diagonal direction.

2. The display device of claim 1, wherein the second light emitting element is disposed on the second recess portion recessed in the diagonal direction and the second protrusion portion protruding in the diagonal direction.

3. The display device of claim 1, wherein each of the first light emitting element and the second light emitting element has a shape extending in a longitudinal direction, and an orientation direction of end portions of the first light emitting element is different from an orientation direction of end portions of the second light emitting element.

4. The display device of claim 1, wherein the second light emitting element is disposed not to be parallel with the first light emitting element.

5. A display device comprising:

a first electrode extending in a first direction;

a second electrode extending in the first direction and spaced apart from the first electrode in a second direction intersecting the first direction; and a plurality of light emitting elements disposed on the first electrode and the second electrode, wherein the first electrode comprises a recess formed by partially recessing a side of the first electrode facing the second electrode, the second electrode comprises a protrusion disposed on a side of the second electrode facing the first electrode and inserted into the recess, the plurality of light emitting elements comprise:

a first light emitting element disposed on portions of the first electrode and the second electrode extending in the first direction, and a second light emitting element disposed on the recess of the first electrode and disposed on the protrusion of the second electrode, the second electrode comprises a first electrode line and a second electrode line spaced apart from each other in the second direction, the first electrode disposed between the first electrode line and the second electrode line, the first electrode line of the second electrode is adjacent to a first side of the first electrode in the second direction, the second electrode line of the second electrode is adjacent to a second side of the first electrode in the second direction, the recess of the first electrode is adjacent to the first side of the first electrode, and the recess of the first electrode is not adjacent to the second side of the first electrode.

6. The display device of claim 5, further comprising:

a first connection electrode disposed on the first electrode; and a second connection electrode comprising:

a first contact portion spaced apart from the first connection electrode in the second direction and disposed on the first electrode line, a second contact portion spaced apart from the first connection electrode in the first direction and disposed on the first electrode, and a first connection portion connecting the first contact portion to the second contact portion, wherein the first connection electrode is in contact with a first end portion of the first light emitting element, the first contact portion of the second connection electrode is in contact with a second end portion of the first light emitting element, and the first connection portion is in contact with a first end portion of the second light emitting element.

7. The display device of claim 6, wherein the plurality of light emitting elements further comprise:

a third light emitting element spaced apart from the first light emitting element in the first direction and disposed on the first electrode line and the first electrode, and a fourth light emitting element spaced apart from the third light emitting element in the second direction and disposed on the second electrode line and the first electrode, and the display device further comprises:

a third connection electrode spaced apart from the first contact portion of the second connection electrode in the first direction and disposed on the first electrode line; and a fourth connection electrode comprising:

a third contact portion spaced apart from the second contact portion in the second direction and disposed on the second electrode line, a fourth contact portion spaced apart from the second contact portion in the first direction and disposed on the first electrode, and a second connection portion connecting the third contact portion to the fourth contact portion.

8. The display device of claim 7, wherein the second contact portion of the second connection electrode is in contact with a first end portion of the third light emitting element and an end portion of the fourth light emitting element, the second connection portion is in contact with a second end portion of the second light emitting element, and the third connection electrode is in contact with a second end portion of the third light emitting element.

9. The display device of claim 7, wherein a width of the second contact portion of the second connection electrode in the second direction is greater than a width of the fourth contact portion of the fourth connection electrode in the second direction.

10. The display device of claim 7, wherein the plurality of light emitting elements further comprise a fifth light emitting element spaced apart from the fourth light emitting element in the first direction and disposed on the second electrode line and the first electrode, and the display device further comprises a common connection electrode in contact with an end portion of the fifth light emitting element and disposed on the second electrode line.

11. The display device of claim 10, wherein the third connection electrode is electrically connected to the common connection electrode.

12. The display device of claim 7, further comprising:

a first insulating layer disposed on the first electrode and the second electrode, a second insulating layer disposed on the plurality of light emitting elements, and a third insulating layer disposed on the second insulating layer, wherein the first connection electrode and the third connection electrode are disposed on the third insulating layer, and the second connection electrode and the fourth connection electrode are disposed between the second insulating layer and the third insulating layer.

13. The display device of claim 12, wherein the first connection electrode and the second connection electrode in contact with end portions of the first light emitting element are disposed on different layers, and the second connection electrode and the fourth connection electrode in contact with end portions of the second light emitting element are disposed on a same layer.

14. A display device comprising:

a plurality of sub-pixels arranged in a first direction and a second direction intersecting the first direction, wherein the plurality of sub-pixels comprise:

a first electrode extending in the first direction;

a second electrode comprising:

a first electrode line disposed on a side of the first electrode in the second direction, and a second electrode line disposed on another side of the first electrode in the second direction; and a plurality of light emitting elements disposed on the first electrode and the second electrode, the first electrode comprises a recess formed by partially recessing a side of the first electrode facing the first electrode line, the first electrode line of the second electrode comprises a protrusion disposed on a side of the second electrode line facing the first electrode and inserted into the recess, and the plurality of light emitting elements comprise:

a first light emitting element disposed on portions of the first electrode and the first electrode line extending in the first direction;

a second light emitting element disposed in the recess of the first electrode and disposed on the protrusion of the second electrode;

a third light emitting element disposed on the first electrode and a portion of the first electrode line extending in the first direction and spaced apart from the first light emitting element in the first direction;

a fourth light emitting element disposed on portions of the first electrode and the second electrode line extending in the first direction and spaced apart from the third light emitting element in the second direction; and a fifth light emitting element disposed on the portions of the first electrode and the second electrode line extending in the first direction and spaced apart from the fourth light emitting element in the first direction.

15. The display device of claim 14, wherein the recess of the first electrode comprises:

a first recess portion recessed in the second direction, and a second recess portion recessed in a diagonal direction intersecting the first direction and the second direction, and the protrusion of the second electrode comprises:

a first protruding portion protruding in the second direction, and a second protruding portion protruding in the diagonal direction.

16. The display device of claim 15, wherein the second light emitting element is disposed on the second recess portion recessed in the diagonal direction and the second protruding portion protruding in the diagonal direction.

17. The display device of claim 15, further comprising:

a first connection electrode disposed on the first electrode;

a second connection electrode comprising:

a first contact portion spaced apart from the first connection electrode in the second direction and disposed on the first electrode line, a second contact portion spaced apart from the first connection electrode in the first direction and disposed on the first electrode, and a first connection portion connecting the first contact portion to the second contact portion;

a third connection electrode spaced apart from the first contact portion of the second connection electrode in the first direction and disposed on the first electrode line;

a fourth connection electrode comprising:

a third contact portion spaced apart from the second contact portion in the second direction and disposed on the second electrode line, a fourth contact portion spaced apart from the second contact portion in the first direction and disposed on the first electrode, and a second connection portion connecting the third contact portion to the fourth contact portion; and a common connection electrode spaced apart from the fourth contact portion in the second direction and disposed on the second electrode line.

18. The display device of claim 17, wherein end portions of the first light emitting element are in contact with the first connection electrode and the first contact portion of the second connection electrode, end portions of the second light emitting element are in contact with the first connection portion of the second connection electrode and the second connection portion of the fourth connection electrode, the first connection electrode and the first contact portion of the second connection electrode are disposed on different layers, and the first connection portion and the second connection portion are disposed on a same layer.

19. The display device of claim 17, further comprising a bank layer surrounding an emission area in which the light emitting elements of the plurality of sub-pixels are disposed, wherein the plurality of sub-pixels comprise:

a first sub-pixel in which the first connection electrode is disposed adjacent to a side of the emission area in the first direction, and a second sub-pixel in which the first connection electrode is disposed adjacent to another side of the emission area in the first direction.

* * * * *